United States Patent
Otose et al.

(10) Patent No.: US 8,937,614 B2
(45) Date of Patent: Jan. 20, 2015

(54) BIDIRECTIONAL SHIFT REGISTER AND DISPLAY DEVICE USING THE SAME

(75) Inventors: Tomohiko Otose, Kawasaki (JP); Masamichi Shimoda, Kawasaki (JP)

(73) Assignee: NLT Technologies, Ltd., Kanagawa (JP)

( * ) Notice: Subject to any disclaimer, the term of this patent is extended or adjusted under 35 U.S.C. 154(b) by 1319 days.

(21) Appl. No.: 12/264,377

(22) Filed: Nov. 4, 2008

(65) Prior Publication Data

US 2009/0115792 A1 May 7, 2009

(30) Foreign Application Priority Data

Nov. 6, 2007 (JP) ................................. 2007-288754
Mar. 27, 2008 (JP) ................................. 2008-083673

(51) Int. Cl.
*G06F 3/038* (2013.01)
*G09G 5/00* (2006.01)
*G11C 19/28* (2006.01)
*G09G 3/36* (2006.01)

(52) U.S. Cl.
CPC .............. *G11C 19/28* (2013.01); *G09G 3/3677* (2013.01)
USPC ............... 345/204; 345/10; 345/60; 345/559; 345/98

(58) Field of Classification Search
None
See application file for complete search history.

(56) References Cited

U.S. PATENT DOCUMENTS

| | | | |
|---|---|---|---|
| 5,859,630 A | 1/1999 | Huq | |
| 7,081,890 B2 | 7/2006 | Park et al. | |
| 7,098,882 B2 | 8/2006 | Kitani et al. | |
| 2002/0075222 A1* | 6/2002 | Miyatake | 345/100 |
| 2003/0128180 A1* | 7/2003 | Kim et al. | 345/100 |
| 2004/0100304 A1* | 5/2004 | Kawase et al. | 326/86 |
| 2004/0104882 A1* | 6/2004 | Kitani et al. | 345/100 |
| 2004/0125069 A1 | 7/2004 | Park et al. | |
| 2007/0164972 A1* | 7/2007 | Chang | 345/100 |

FOREIGN PATENT DOCUMENTS

| | | |
|---|---|---|
| CN | 1504989 | 6/2004 |
| CN | 1514421 | 7/2004 |
| JP | 2001-506044 | 5/2001 |
| JP | 2004-185684 | 7/2007 |

OTHER PUBLICATIONS

First Notice of Examination Opinion issued Jan. 18, 2012 by the Chinese Patent Office in Chinese Patent Application No. 200810190900.1, with partial translation, 14 pages.

* cited by examiner

*Primary Examiner* — Jesus Hernandez
(74) *Attorney, Agent, or Firm* — Young & Tho9mpson

(57) ABSTRACT

A device, in which circuit size is small and operation is stable, comprises a plurality of serially connected unit registers (shift registers) in which transfer is controlled by any of three or more clock signals each having a different phase, and a setting signal which determines shift direction; and a selection circuit (switch array) which can select at least one clock signal from the three or more clock signals in accordance with the setting signal; wherein the unit registers are put in a reset state by one clock signal selected by the selection circuit, corresponding to each of the unit registers

18 Claims, 32 Drawing Sheets

FIG. 32  COMPARATIVE CASE
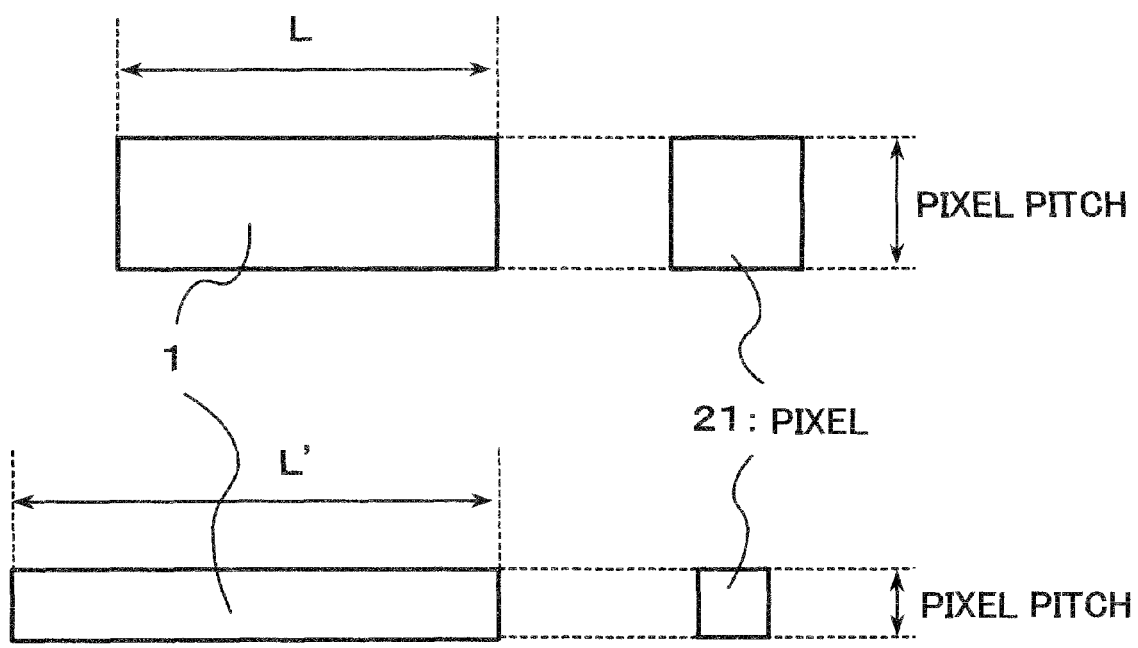

US 8,937,614 B2

BIDIRECTIONAL SHIFT REGISTER AND DISPLAY DEVICE USING THE SAME

REFERENCE TO RELATED APPLICATION

This application is based upon and claims the benefit of the priority of Japanese patent applications No. 2007-288754 filed on Nov. 6, 2007, and No. 2008-083673 filed on Mar. 27, 2008, the disclosure of which is incorporated herein in its entirety by reference thereto.

FIELD OF THE INVENTION

This invention relates to bidirectional shift registers and to display devices using the same, and in particular, to a bidirectional shift register preferably used in a scanning circuit, and to a display device using the same.

BACKGROUND OF THE INVENTION

Since flat display devices represented by liquid crystal display devices, are thin, light-weight, and have low power consumption, they are widely used as display devices in all types of apparatus. Recently, in order to realize even thinner, lighter and lower cost devices, in comparison with conventional amorphous silicon thin film transistors, technology has been established in which a drive circuit is configured using a low temperature polysilicon thin film transistor with high electron mobility, and this drive circuit is formed integrally on a glass substrate.

Furthermore, high resolution requirements of liquid crystal display devices in recent years are increasing day by day. The fact that amounts of information displayed at one time are increasing due to increasing resolution contributes to increased added value of the liquid crystal display devices. Moreover, by having a display device handle bidirectional scanning, it is possible to change direction of image to be displayed, according to direction of the liquid crystal display device. Therefore, it is desired to realize a liquid crystal display device with high added value, having a high resolution display region and a bidirectional scanning circuit.

Technology for realizing this type of liquid crystal display device is disclosed in Patent Documents 1 and 2. FIG. 28 is a schematic diagram of a flat display device described in Patent Document 1. In FIG. 28, a scanning line drive circuit 102, a signal line drive circuit 103, and a plurality of (m×n) of switching elements 110 are disposed on an array substrate 101, in the flat display device. Scanning lines G1~Gn are lines for transferring output of the scanning line drive circuit 102, as control signals of the switching elements 110. Furthermore, signal lines S1~Sm are lines for transferring output of the signal line drive circuit 103 to source-drain of the switching elements 110.

In the abovementioned liquid crystal display device, a bidirectional shift register is used in at least one of the scanning line drive circuit 102 and the signal line drive circuit 103 The bidirectional shift register is configured from a plurality of unit registers connected in series, and has a function of shifting in a forward direction or a reverse direction by a three-phase shift clock signal.

FIG. 29 is circuit diagram of a unit register constituting a bidirectional shift register described in Patent Document 1. In FIG. 29, the unit register is provided with clock terminals C1, C2, and C3, a forward direction pulse input terminal INP, reverse direction pulse input terminal INN, an output terminal OUT, and shift direction control signals P and N, and is constituted of transistors tr1~tr17.

An output circuit is constituted of the transistor tr1 having a conductive path between the clock terminal C1 and the output terminal OUT, and the transistor tr2 having a conductive path between a power supply electrode VDD and the output terminal OUT.

Furthermore, a transistor tr3 having a conductive path between the forward direction pulse input terminal INP and a control electrode of the transistor tr1, a transistor tr4 having a conductive path between the reverse direction pulse input terminal INN and the control electrode of the transistor tr1, and a transistor tr5 having a conductive path between the power supply electrode VDD and a control electrode of the transistor tr2, are provided, and an input circuit is provided which, in a forward direction pulse shift, conducts between the transistor tr3 and the transistor tr1, and also conducts between the forward direction pulse input terminal INP and a control electrode of the transistor tr5, and in a reverse direction pulse shift, conducts between the transistor tr4 and the transistor tr1, and also conducts between the reverse direction pulse input terminal INN and the control electrode of the transistor tr5.

Furthermore, a transistor tr6 having a conductive path between the clock terminal C2 and a control electrode of the transistor tr2, a transistor tr7 having a conductive path between the clock terminal C3 and the control electrode of the transistor tr2, and a transistor tr8 having a conductive path between the power supply electrode VDD and the control electrode of the transistor tr1, are provided, and a reset circuit is provided which, in a forward direction pulse shift, conducts between control electrodes of the transistor tr6 and the transistor tr2 and a control electrode of the transistor tr8, and in a reverse direction pulse shift, conducts between control electrodes of the transistor tr7 and the transistor tr2 and the control electrode of the transistor tr8.

Furthermore, an inversion prevention circuit is included which prevents voltage level in the control electrode of the transistor tr2 from inverting, in cases in which a voltage level of a clock signal inputted to the clock terminal C1 in a state in which the transistor tr1 is ON and the transistor tr2 is OFF, is inverted.

Moreover, the input circuit includes a transistor tr11 having a conductive path between the transistor tr3 and the control electrode of the transistor tr1, a transistor tr12 having a conductive path between the transistor tr4 and the transistor tr1, a transistor tr13 having a conductive path between the forward direction pulse input terminal INP and the transistor tr5, and a transistor tr14 having a conductive path between the reverse direction pulse input terminal INN and the transistor tr5; and turns ON the transistor tr11 and the transistor tr13 in the forward direction pulse shift, and turns ON the transistor tr12 and the transistor tr14 in the reverse direction pulse shift.

Furthermore, the reset circuit includes a transistor tr15 having a conductive path between the transistor tr6, the transistor tr2, and the transistor tr8, and a transistor tr16 having a conductive path between the transistor tr7, the transistor tr2, and the transistor tr8; and turns ON the transistor tr15 in the forward direction pulse shift, and turns ON the transistor tr16 in the reverse direction pulse shift.

Moreover, the inversion prevention circuit includes a transistor tr9 having a conductive path between the power supply electrode VDD and the control electrode of the transistor tr2, and a conductive path to the control electrode of the transistor tr1, and a transistor tr10 having a conductive path between the transistor tr9 and the transistor tr2, and a conductive path to the clock terminal C1.

According to the bidirectional shift register composed of this type of unit register, it is possible to prevent occurrence of variations in output signal, in the forward direction pulse shift and in the reverse direction pulse shift.

Next, a description will be given concerning a configuration of a bidirectional shift register disclosed in Patent Document 2. FIG. 30 is a block diagram of shift registers including cascade stages, in Patent Document 2. FIG. 30 has a configuration of a bidirectional scanning circuit in which outputs OUTn are arranged in a cascade. Each shift register stage 212 is driven by any of three-phase clock signals C1, C2, and C3, outputted from a clock generator 201. By switching the clock signals C1, C2, and C3, a shift direction of the shift register is controlled to be from bottom to top or from top to bottom.

FIG. 31 is a circuit diagram of a shift register stage (unit register) 212 used in the shift register of FIG. 30. The shift register stage 212 is provided with NMOS transistors 216, 217, 218, 218a, 219, 220, 220a, 221, 221a, 225, and 225a.

In the NMOS transistor 216, a gate is connected to a node P1, a clock signal C1 (C3) is supplied to a drain, and a source is output OUTn. In the NMOS transistor 217, a gate is connected to a node P2, a drain is output OUTn, and a source is connected to a power supply VSSI. The NMOS transistors 216 and 217 form an output circuit and make active the output OUTn according to voltage level of the nodes P1 and P2.

Each of the NMOS transistors 218 and 218a are diode-connected, outputs OUTn−1 and OUTn+1 of adjacent shift register stages are connected to drains, and sources are commonly connected to the node P1. The NMOS transistors 218 and 218a form an input circuit from an adjacent shift register stage.

In the NMOS transistor 219, a gate is connected to the node P2, a drain is connected to the node P1, a source is connected to the power supply VSSI, and when the node P2 has a high level, the node P1 is at a low level.

In each of the NMOS transistors 220 and 220a, a drain is commonly connected to the power supply VDD, outputs OUTn+2 and OUTn−2 of shift register stages are connected to gates, and sources are commonly connected to the node P2. The NMOS transistors 220 and 220a are equivalent to a reset circuit.

In each of the NMOS transistors 221 and 221a, a drain is commonly connected to the node P2, outputs OUTn−1 and OUTn+1 of shift register stages are connected to gates, and sources are commonly connected to the power supply VSS. The NMOS transistors 221 and 221a form an input circuit from adjacent shift register stages.

In each of the NMOS transistors 225 and 225a, a drain is commonly connected to the node P1, outputs OUTn+2 and OUTn−2 of shift register stages are connected to gates, and sources are commonly connected to a power supply VDDI. The NMOS transistors 225 and 225a are equivalent to a reset circuit.

The shift register stage 212 configured as above outputs either of OUTn−1 and OUTn+1 of one adjacent shift register stage to another adjacent shift register stage from the output OUTn by the clock signal C1 (C3). In addition, output OUTn is put in a reset state by outputs OUTn+2 and OUTn−2 of two shift register stages away.

The shift register in which the shift register stages 212 are connected in series in this way does not require signals (P and N in FIG. 29) prescribing scanning direction, with regard to Patent Document 1, and realizes bidirectional scanning.

[Patent Document 1]
JP Patent Kokai Publication No. JP-P2004-185684A (FIG. 1 and FIG. 4)

[Patent Document 2]
JP Patent Kokai Publication No. JP-P2001-506044A (FIG. 1 and FIG. 2)

SUMMARY OF THE DISCLOSURE

The entire disclosures of Patent Documents 1 and 2 are incorporated herein by reference thereto.

The following analysis is given by the present invention.

Realizing a liquid crystal display device with high added value, using a conventional bidirectional shift register, has the following problems.

For example, in Patent Document 1, in order to realize bidirectional scanning, it is necessary to redundantly install circuit elements having a similar function. That is, as shown in FIG. 29, transistors tr11 and tr3, and tr12 and tr4, are controlled respectively by signals P and N, and INP and INN. These have states in which one is in an active state and another is in an operation stoppage state, according to respective scanning directions. In the same way, combinations of tr13 and tr14, tr15 and tr6, and tr16 and tr7, have states in which one is in an active state and another is in an operation stoppage state, according to respective scanning directions. Accordingly, since the bidirectional shift register with such a configuration needs to have circuit elements that are active and inactive according to scanning direction, there is a tendency for circuit size to become large.

Here, in general it is desirable that array pitch of pixels and array pitch of shift registers making up a scanning circuit have a similar length. This is evident from a viewpoint of layout of electrical wiring transferring signals outputted from the scanning circuit. Along with increasingly higher resolution of display devices, both array pitch of pixels and array pitch of shift registers are becoming smaller. That is, as shown in FIG. 32, along with shrinking of the array pitch of a pixel 21, circuit width L of the shift register 1 increases as in L'. Due to L increasing, there is a problem in that, with regard to display devices, frame-edge (or margin) of a side in which the scanning circuit is disposed becomes large. Furthermore, in design of the display devices, in cases in which it is desired to have a display section in the device center, it is necessary to enlarge the frame-edge to the same length on the side in which the scanning circuit is disposed and also on an opposite side. Accordingly, in the bidirectional scanning circuit in Patent Document 1, it can be said that it is difficult to both shrink the array pitch and have a narrow frame-edge (margin) for the display device.

On the other hand, in Patent Document 2, there is no necessity to layout a circuit with similar circuit elements in duplicate, according to scanning direction, as in Patent Document 1. However, timing of resetting nodes such as P1, P2 and the like in FIG. 31, being one time for one frame, leads to another problem of electrical potential variation in the above nodes. That is, in a certain clock cycle, a reset node is floating in a remaining period of one frame. In this floating period, due to leak current of a transistor connected to the node in question, or to noise applied from outside and the like, electrical potential of the node varies. Due to this electrical potential variation, a circuit element that should inherently (by right) maintain an ON state or an OFF state, manifests different behavior, and there is a risk of stable operation of the circuit being impaired.

From the above, if a bidirectional scanning circuit or a display device provided with a bidirectional scanning circuit is realized by conventional technology, a problem arises of either the difficulty of both having a narrow pitch and a narrow frame-edge (margin) with a large circuit size, or stable operation of the circuit being impaired.

Therefore, it is an object of the present invention to provide a bidirectional shift register with small circuit size and stable operation, and a display device using the same.

In one aspect of the present invention, there is provided a bidirectional shift register comprising a plurality of serially connected unit registers in which transfer is controlled by any of three or more clock signals each having a different phase from one another and a setting signal which determines shift direction; and a selection circuit which can select at least one clock signal from the three or more clock signals in accordance with the setting signal. The bidirectional shift register is configured such that the unit registers are put in a reset state by one clock signal selected by the selection circuit, corresponding to each of the unit registers.

In the bidirectional shift register of the present invention, a unit register may be provided with an output terminal; an output circuit which drives the output terminal; an input circuit into which an output signal of an adjacent unit register and a setting signal are inputted and which drives the output circuit to put the output terminal at an active level, based on the output signal and the setting signal; and a reset transistor which drives the output circuit so as to put the output terminal at an inactive level by one clock signal selected by the selection circuit.

The bidirectional shift register of the present invention may be such that the output circuit includes a first output transistor which provides control to put the output terminal at an inactive level; and the reset transistor is diode-connected, one clock signal selected by the selection circuit is supplied to a drain, and a source is connected to a gate of the first output transistor.

The bidirectional shift register of the present invention may be such that the output circuit includes a second output transistor which provides control to put the output terminal at an active level; the input circuit includes a first, second, and third input transistor. The first input transistor may be diode-connected, another clock signal selected by the selection circuit may be supplied to a drain, and a source may be connected to a drain of the second and third input transistors. With regard to the second and third input transistors, output signals of one and another adjacent unit registers may be supplied to respective gates thereof, and sources may be commonly connected to a gate of the second output transistor.

The bidirectional shift register of the present invention may be configured such that the selection circuit includes a switch element which is switched to an ON state or an OFF state according to the setting signal, and by this switch element, three or more clock signals may be selectively outputted to unit registers.

The bidirectional shift register of the present invention may be configured such that the selection circuit is provided with at least a first selection transistor and a second selection transistor. In the first selection transistor, wiring for any of the three or more clock signals may be connected to a gate electrode and a source electrode, a drain electrode is connected to a source electrode of the second selection transistor. And in the second selection transistor, wiring for the setting signal may be connected to a gate electrode, and one clock signal selected from a drain electrode is outputted.

The bidirectional shift register of the present invention may be such that the first selection transistor is controlled to an ON state or an OFF state by any of the three clock signals, and the second selection transistor is controlled to an ON state or an OFF state by the setting signal.

In the bidirectional shift register of the present invention, the unit register may be provided with an output terminal, an output circuit which drives the output terminal, and an input circuit into which an output signal of an adjacent unit register and the setting signal are inputted, and which drives the output circuit to put the output terminal at an active level, based on the output signal and the setting signal. The output circuit may include a first output transistor in which one clock signal selected by the selection circuit is supplied to a gate, to perform control to put the output terminal at an inactive level.

The bidirectional shift register of the present invention may be configured such that the output circuit includes a second output transistor which performs control to put the output terminal at an active level, the input circuit includes first and the second input transistors; with regard to the first and the second input transistors, another clock signal selected by the selection circuit is supplied to a drain of one of the first and the second input transistors selected by the setting signal, output signals of one and another adjacent unit registers are supplied to respective gates thereof, and sources thereof are commonly connected to a gate of the second output transistor.

The bidirectional shift register of the present invention may be such that the selection circuit is provided for all of the plurality of unit registers, or per a prescribed number of unit registers.

The display device of the present invention is preferably a display device provided with a pixel array in which a plurality of pixels are arrayed, and a scanning circuit which makes the pixels active, and the scanning circuit preferably includes the abovementioned bidirectional shift register.

The display device of the present invention may be such that the transistors included in the bidirectional shift register and switch transistors in the pixels are composed of only one of either NMOS transistors or PMOS transistors.

The display device of the present invention may be such that scanning circuits are provided on both sides of a disposed region of the pixel array.

In the display device of the present invention, the scanning circuits provided on both sides of the disposed region of the pixel array may drive a gate of an identical switch transistor at the same time.

The meritorious effects of the present invention are summarized as follows.

According to the present invention, by putting a unit register in a reset state by a selected clock signal, bidirectional scanning, which operates stably, is realized, without enlarging circuit size.

BRIEF DESCRIPTIONS OF THE DRAWINGS

FIG. 32 is a diagram describing pixel pitch and circuit width L.

PREFERRED MODES OF THE INVENTION

Figure 1:
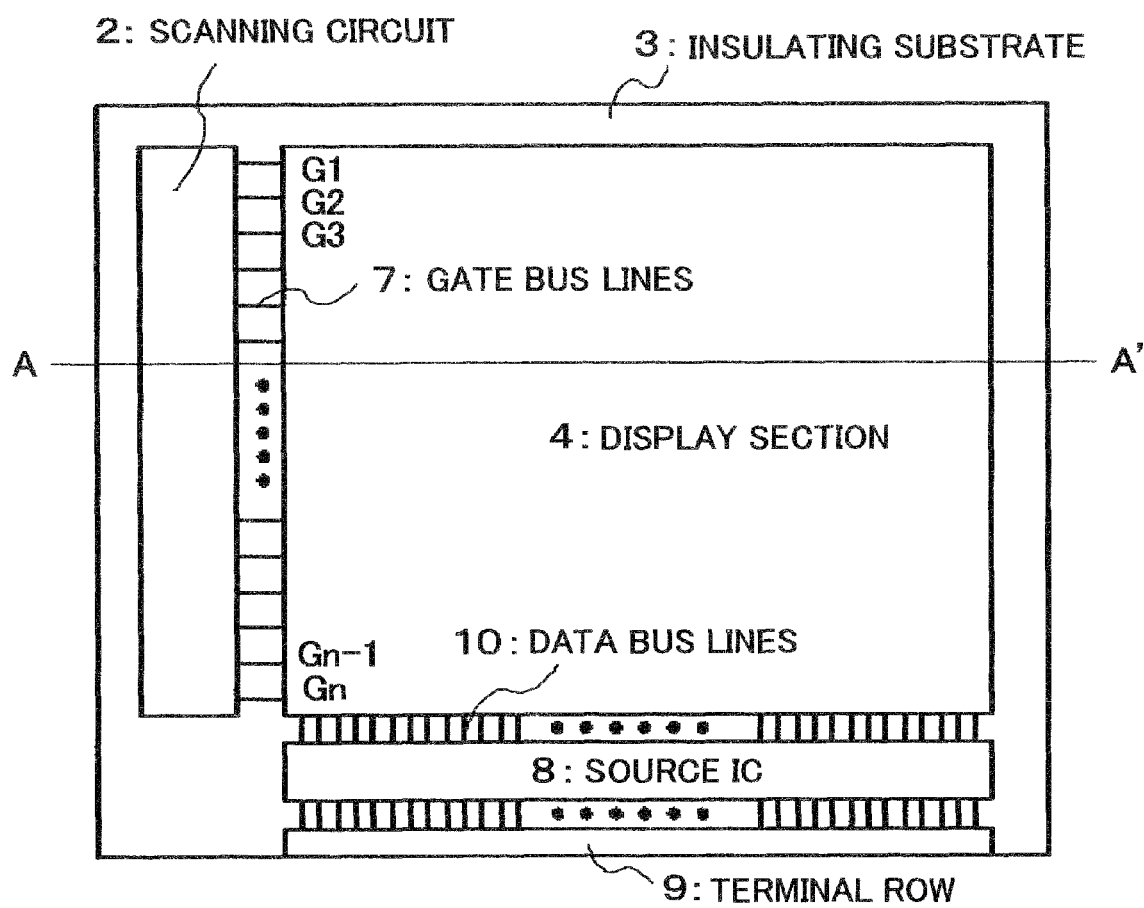
FIG. 1 is a configuration diagram showing a display device according to a first exemplary embodiment of the present invention.

A semiconductor circuit according to a mode of the present invention, in which a bidirectional shift register, controlled by a plurality of signals including at least three clock signals and a signal prescribing transfer direction, is arranged in a cascade and in an arrayed fashion, has a selection unit (means) which can appropriately select a clock signal inputted to the bidirectional shift register, in accordance with the signal prescribing transfer direction.

The selection unit is preferably composed of a switch circuit; the switch circuit is switched to an ON state or and OFF state by the signal prescribing transfer direction; and an inputted clock signal is outputted to a set discretionary terminal.

Furthermore, a selection circuit is preferably composed of at least a first selection transistor and a second selection transistor, a clock signal is connected to a gate electrode and a source electrode of the first selection transistor, a drain electrode of the first selection transistor is connected to a source electrode of the second selection transistor, and a setting signal is connected to a gate electrode of the second selection transistor.

Moreover, the selection circuit is preferably composed of at least the first selection transistor and the second selection transistor; the first selection transistor is controlled to have an ON state or an OFF state by a clock signal; and the second selection transistor is controlled to have an ON state or an OFF state by the setting signal.

Furthermore, a unit register is preferably provided with an output terminal, an output circuit which drives the output terminal, and an input circuit into which an output signal of an adjacent unit register and a setting signal are inputted, and which drives the output circuit to put the output terminal at an active level, based on the output signal and the setting signal; and an electrical signal, outputted from the selection circuit, for putting the output terminal at an inactive level, is inputted to the output circuit.

Moreover, the output circuit preferably includes a first output transistor which performs control to put the output terminal at an inactive level.

Furthermore, the output circuit preferably includes a second output transistor which performs control to put the output terminal at an active level, the input circuit preferably includes the first and the second input transistors; with regard to the first and the second input transistors, output signals of one and another adjacent unit registers are supplied to respective gates thereof, and sources thereof are commonly connected to a gate of the second output transistor.

Moreover, the selection unit is preferably disposed per plurality of bidirectional shift registers.

In a display device that is provided with a pixel array in which a plurality of pixels are arrayed, and a scanning circuit which makes the pixels active, the scanning circuit is preferably composed of the abovementioned semiconductor circuit.

Furthermore, in a display device that is provided with the pixel array in which a plurality of pixels are arrayed, and scanning circuits which make the pixels active, on both sides of the pixel array, the scanning circuits are preferably composed of the abovementioned semiconductor circuits.

The semiconductor circuit is preferably composed of NMOS transistors only, or PMOS transistors only.

A bidirectional shift register according to the exemplary embodiment of the present invention has unit registers, controlled by a plurality of signals including at least three clock signals and a signal prescribing transfer direction, arranged in a cascade (and in an array), and a selection unit which can appropriately select a clock signal inputted to the unit registers, in accordance with the signal prescribing transfer direction. By having this type of selection unit, since a clock signal in accordance with the signal prescribing transfer direction is inputted to the unit registers, desired bidirectional scanning is possible, without enlarging circuit size.

Furthermore, in the bidirectional shift register of the present invention, the selection unit is composed of a switch circuit; the switch circuit is switched to an ON state or and OFF state by the signal prescribing transfer direction; and an inputted clock signal is outputted to a set discretionary terminal. Since this type of selection unit is composed of a switch circuit, it is possible to perform a desired operation by a simple circuit configuration.

In addition, in the bidirectional shift register of the present invention, the selection unit is arranged per plurality of unit registers. Since one selection unit is used to supply clock signals to a plurality of unit registers, it is possible to make circuit size of a unit register small.

The display device of the present invention is provided with the pixel array in which a plurality of pixels are arrayed, and the scanning circuit which makes the pixels active, and the scanning circuit is composed of the abovementioned bidirectional shift register. As a result, since the scanning circuit used has a relatively small circuit size, it is possible to realize the display device with a narrow frame-edge (or margin).

The display device of the present invention is provided with the pixel array in which a plurality of pixels are arrayed, and scanning circuits which makes the pixels active, on both sides of the pixel array, and the scanning circuits are composed of the bidirectional shift register. As a result, even in cases in which load of capacitance component and resistance component of the pixel array is large, it is possible to realize the display device that provides good display picture quality.

In the present invention, the semiconductor circuit composed of the bidirectional shift register and the display device, is composed of NMOS transistors only, or PMOS transistors only. As a result, it is possible to realize the semiconductor circuit or the display device at low cost.

Below, a detailed description is given according to an exemplary embodiment, making reference to the drawings.

First Exemplary Embodiment

Figure 6:
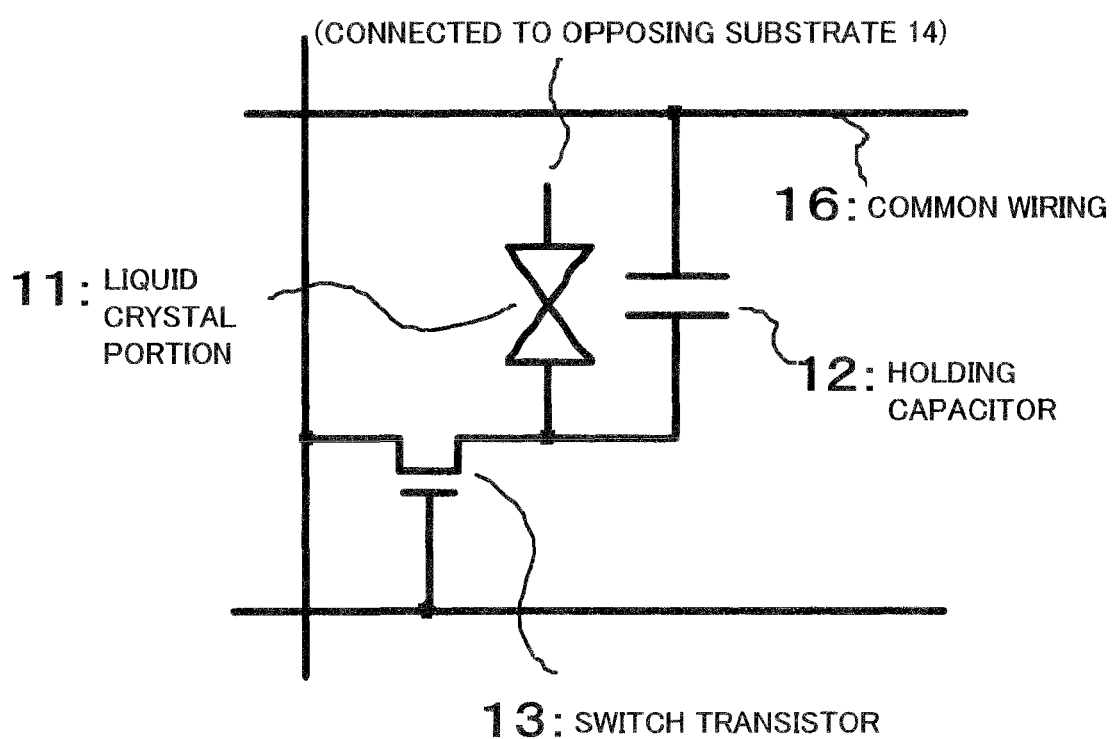
FIG. 6 is a circuit diagram of a pixel portion of the display device according to the first exemplary embodiment of the invention.

FIG. 1 is a drawing showing a configuration of a display device according to a first exemplary embodiment of the present invention. In FIG. 1, in the display device, a display section 4, a scanning circuit 2, gate bus lines 7 (G1, G2, G3, ... Gn-1, Gn), a source IC 8, a terminal row 9, and data bus lines 10 are installed on an insulating substrate 3, formed from transparent glass substrate. The scanning circuit 2 drives gates of switch transistors of pixels in the display section 4, via the gate bus lines 7. Furthermore, the source IC 8 supplies signals inputted from the terminal row 9 to sources of the switch transistors of the pixels of the display section 4, via the data bus lines 10. In the display section 4, a plurality of pixels, as shown in FIG. 6, described later, is arrayed.

Figure 2:
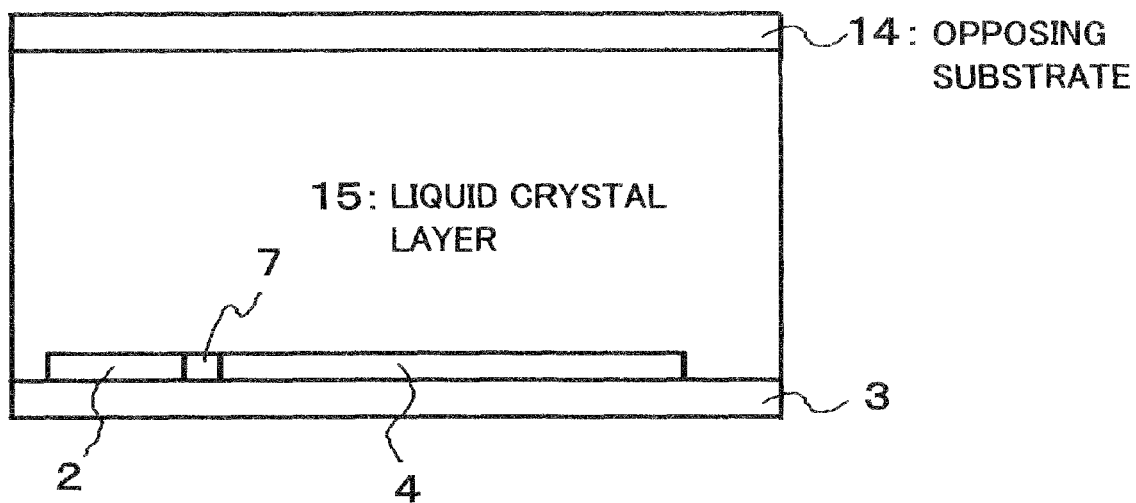
FIG. 2 is a cross-sectional view of the display device according to the first exemplary embodiment of the invention.

FIG. 2 is a cross-sectional view (A-A') of FIG. 1. In FIG. 2, the display device is composed of the insulating substrate 3, an opposing substrate 14, and a liquid crystal layer 15, and the liquid crystal layer 15 is sandwiched between the insulating substrate 3, the opposing substrate 14, and a gap control means not shown in the drawing.

Figure 3:
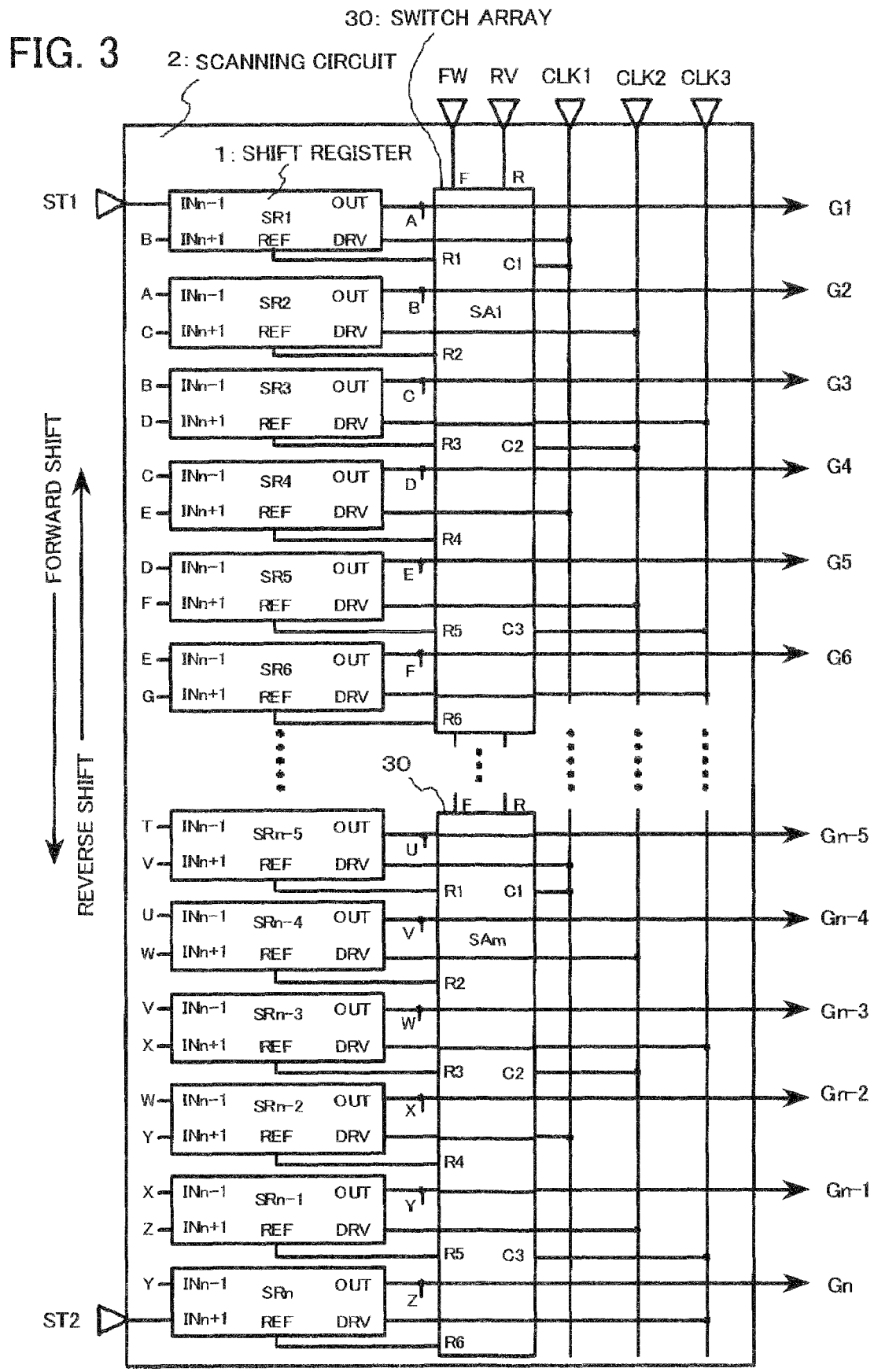
FIG. 3 is a block diagram showing a configuration of a scanning circuit according to the first exemplary embodiment of the invention.

FIG. 3 is a block diagram showing a configuration of a scanning circuit according to the first exemplary embodiment of the present invention. In FIG. 3, the scanning circuit 2 is composed of a plurality of shift registers 1 (unit registers represented by SR1, SR2, SR3, ... SRn-1, SRn), a plurality of switch arrays 30 (SA1, SA2, ... SAm), and line groups (lines connected to terminals CLK1, CLK2, CLK3, ST1, ST2, FW, and RV). The gate bus lines 7 (G1, G2, G3, ... Gn-1, Gn) are connected to OUT terminals of each of the shift registers 1 of the scanning circuit 2, and signals from the OUT terminals of the shift registers 1 are transferred to the connected gate bus lines 7. Note, in FIG. 3 a node A of OUT terminal of a first shift register (SR1) is connected to an input node A of the next shift register (SR2), and so on, in a cascade fashion.

Figure 4:
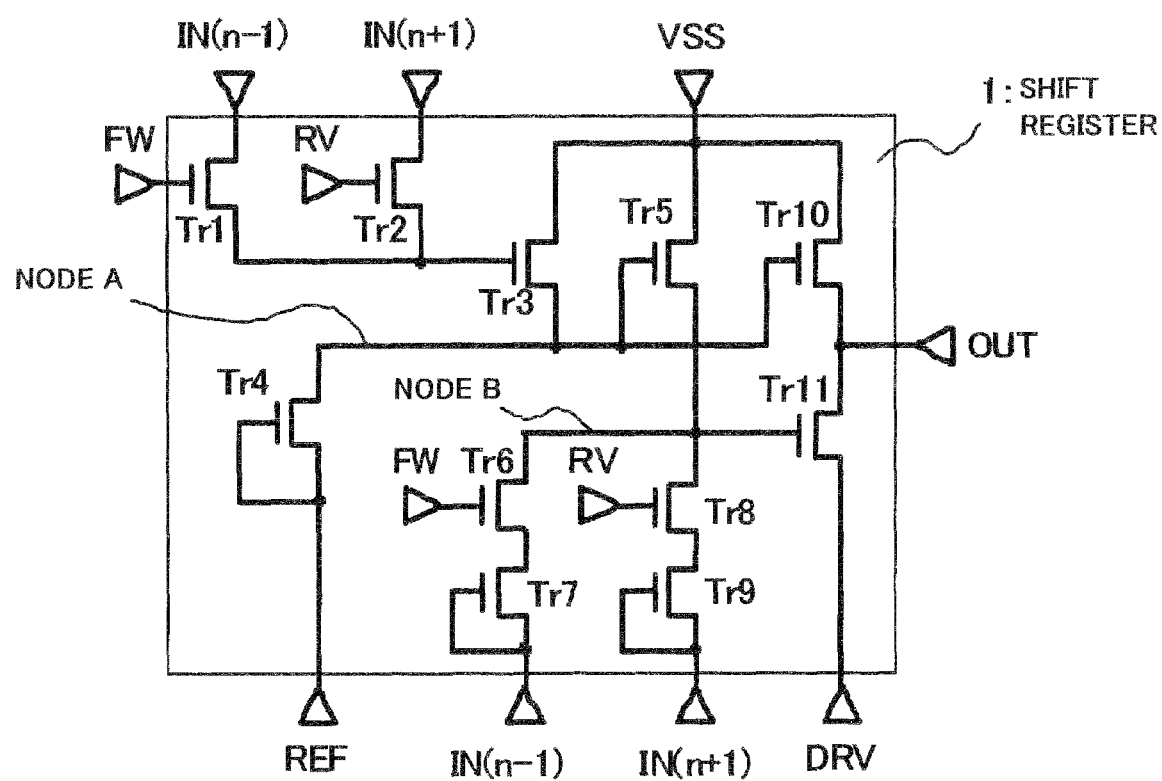
FIG. 4 is a circuit diagram showing a configuration of a shift register according to the first exemplary embodiment of the invention.

FIG. 4 is a circuit diagram showing a configuration of a shift register (unit register) according to the first exemplary embodiment of the present invention. In FIG. 4, the shift register 1 is provided with NMOS transistors Tr1~Tr11, and terminals IN(n-1), IN(n+1), DRV, REF, FW, RV, OUT, and VSS.

Gates of the NMOS transistors Tr1 and Tr2 are respectively connected to FW and RV, drains are connected to IN(n-1) and IN(n+1), and sources are commonly connected to a gate of the transistor Tr3. A source of the NMOS transistor Tr3 is connected to VSS, and a drain is connected to a gate of the NMOS transistor Tr10 as a node A.

The NMOS transistor Tr4 is diode-connected, a drain is connected to REF, and a source is connected to the node A. A gate of the NMOS transistor Tr5 is connected to the node A, a source is connected to VSS, and a drain is connected to a gate of the NMOS transistor Tr1 as a node B.

A gate of the NMOS transistor Tr6 is connected to FW, and a drain is connected to IN(n-1) via a diode-connected NMOS transistor Tr7. A gate of the NMOS transistor Tr8 is connected to RV, and a drain is connected to IN(n+1) via a diode-connected NMOS transistor Tr9.

A source of the NMOS transistor Tr10 is connected to VSS, and a drain is connected to OUT. A source of the NMOS transistor Tr11 is connected to OUT, and a drain is connected to DRV.

In the shift register 1 configured in this way, Tr1~Tr3 and Tr6~Tr9 have an input circuit function, Tr4 and Tr5 have a reset circuit function, and Tr10 and Tr11 have an output circuit function.

Furthermore, in the shift register 1, the IN(n-1) terminal is connected, among adjacent shift registers 1, to an OUT terminal of an upper-side shift register 1. The IN(n+1) terminal is connected, among adjacent shift registers 1, to an OUT terminal of a lower-side shift register 1. Moreover, signals of any of CLK1, CLK2, and CLK3 are respectively inputted to the DRV terminal. Furthermore, a signal outputted from the switch array 30 is inputted to the REF terminal. Moreover, control signals prescribing scanning direction of the scanning circuit 2 are respectively inputted to FW and RV terminals. Furthermore, ST1 and ST2, as start signals for starting transfer, are respectively inputted to the IN(n-1) terminal of the shift register 1 (SR1) and the IN(n+1) terminal of the shift register 1 (SRn). Moreover, at an OUT terminal, a signal at a high level or a low level is outputted by an operation of a shift register 1, and this signal is applied to a gate bus line 7. At VSS, a constant voltage equivalent to a low level signal is applied.

Figure 5:
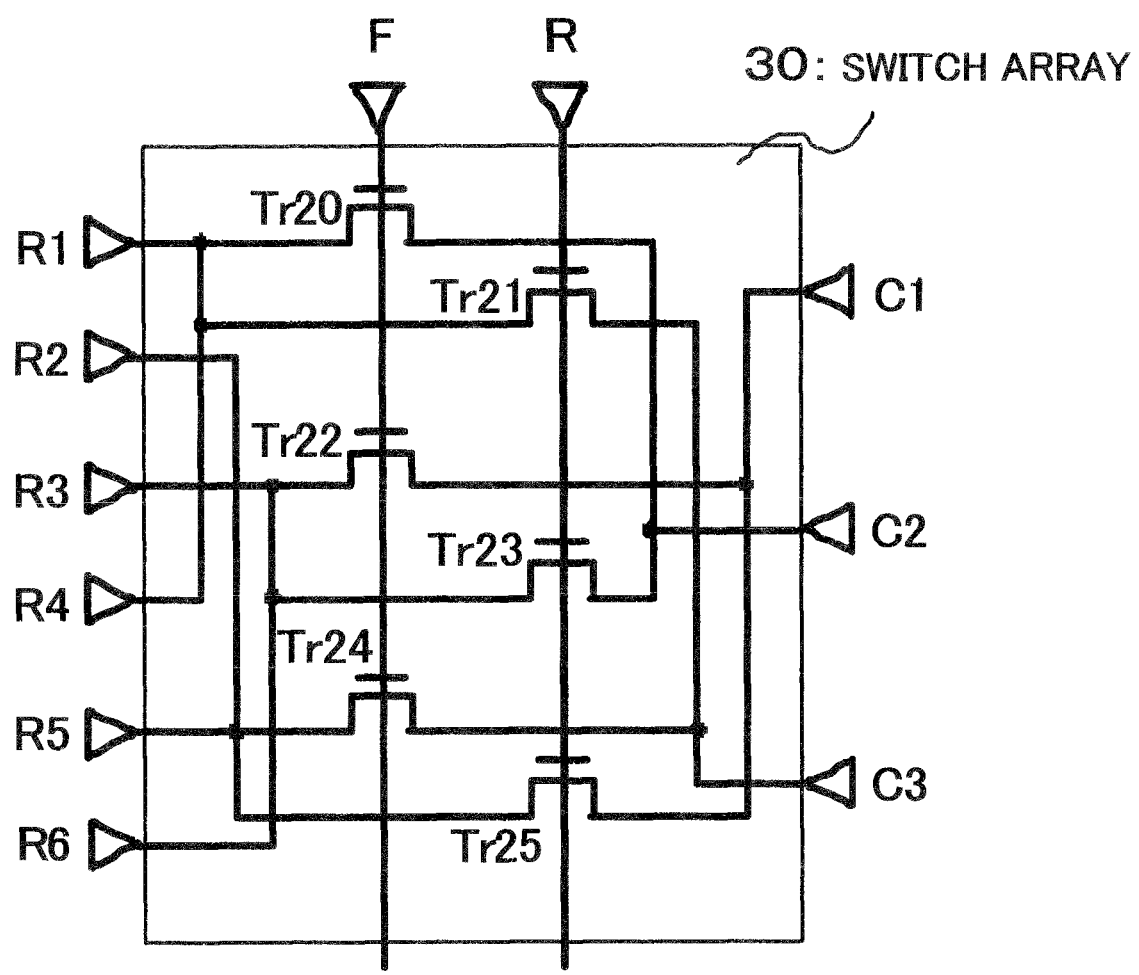
FIG. 5 is a circuit diagram showing a configuration of a switch array according to the first exemplary embodiment of the invention.

FIG. 5 is a circuit diagram of a switch array according to the first exemplary embodiment of the present invention. In FIG. 5, the switch array 30 is provided with NMOS transistors Tr20~Tr25, and terminals F, R, C1~C3, and R1~R6. The terminal F (FW) is connected to gates of Tr20, Tr22, and Tr24, and the terminal R. (RW) is connected to gates of Tr21, Tr23, and Tr25, respectively. One end of Tr22 and Tr25, one end of Tr20 and Tr23, and one end of Tr21 and Tr24 are connected to C1~C3, respectively. The other end of Tr20 and Tr21, the other end of Tr22 and Tr23, and the other end of Tr24 and Tr25 are connected to R1 and R4, R3 and R6, and R2 and R5, respectively. CLK1~CLK3 are respectively connected to C1~C3. Furthermore, R1~R6 are respectively connected to REF terminals of six of the shift registers 1. Each transistor is controlled to have an ON state or an OFF state by the FW or RV signal. In the configuration of FIG. 3, the length of the switch array 30 in a longitudinal direction of the drawing corresponds to six of the shift registers 1.

By providing this type of switch array 30, an element circuit (reset circuit) for setting the node A of the shift register shown in FIG. 4 to a high level is the diode-connected Tr4 only. Tr5 functions as a reset inverting circuit. In a circuit (refer to FIG. 29) shown in Patent Document 1, according to each shift direction, one other diode-connected transistor tr6 besides tr15, and one other diode-connected transistor tr7 besides tr16 are necessary. Against this, by adopting a circuit configuration as shown in FIG. 4, a reduction of three transistors is possible.

Furthermore, since the switch array 30 is laid out over a plurality of shift registers 1, it is possible to ensure a long space in a longitudinal direction, and it is possible to shorten width in a lateral direction. Therefore, frame-edge (margin) width of the display device (length in lateral direction in FIG. 1) can be made short. According to this switch array 30, since a clock signal supplied to the REF terminal of each of the shift registers 1 can be collectively switched and transferred by this switch array 30, simplified circuits can be applied to the shift registers 1.

Figure 30:
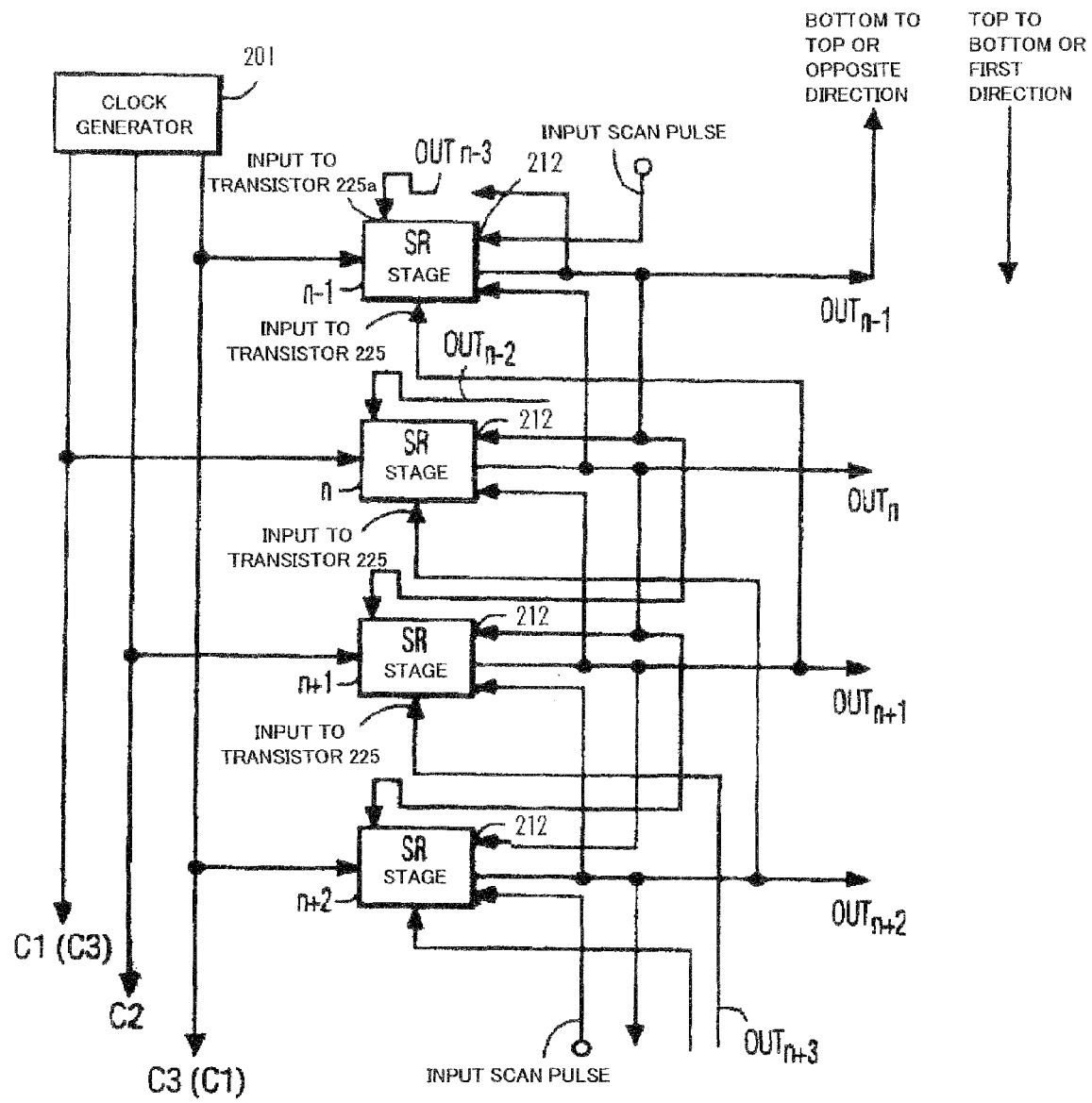
FIG. 30 is a block diagram of a shift register of Patent Document 2.
Figure 31:
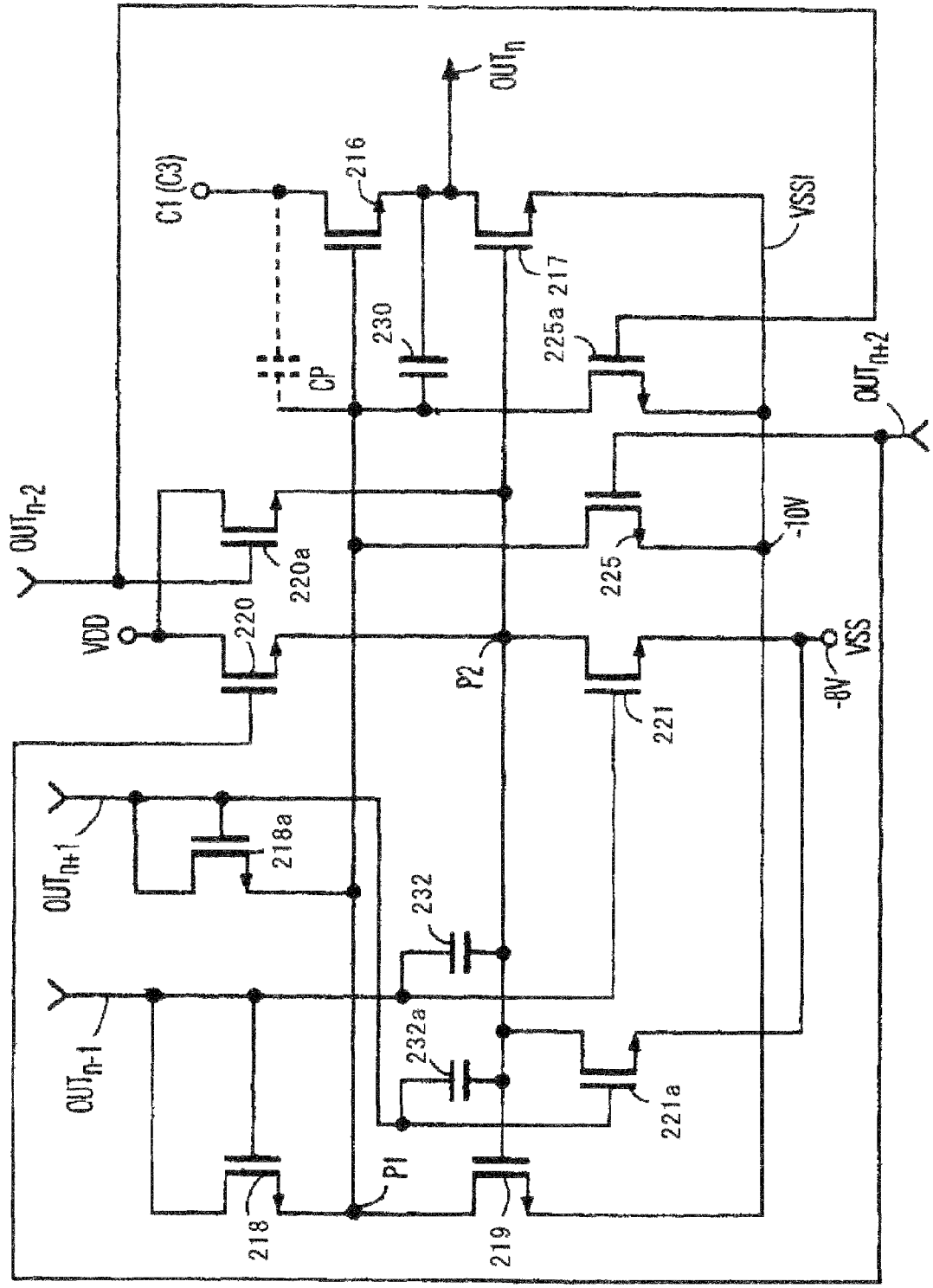
FIG. 31 is a circuit diagram of a shift register stage used in the shift register of Patent Document 2.

Moreover, FIG. 3 shows an example of arranging one switch array 30 for six shift registers 1. However, there is no limitation thereto, and if drive capability of the switch array 30 is high, the switch array 30 may be arranged for more of the shift registers 1. In an extreme case, it is possible to provide one switch array for all of the shift registers 1. That is, a configuration may be such that a switch array 30 equivalent to a clock generator 201 (refer to FIG. 30 of instant application) in Patent Document 2 is built in, and a clock signal switched.

FIG. 6 is a circuit diagram of a pixel portion of the display device of the present exemplary embodiment. In FIG. 6, the pixel is composed of a switch transistor 13, a liquid crystal portion (liquid crystal capacitor) 11, and a holding capacitor 12. A gate part of the switch transistor 13 is connected to the gate bus lines 7, the data bus lines 10 are connected to one side of a source-drain portion, and ends of the liquid crystal portion 11 and the holding capacitor 12 are respectively connected to the other side. The other end of the liquid crystal portion 11 is connected to an opposing substrate 14, and the other end of the holding capacitor 12 is connected to common wiring 16. The common wiring 16 is electrically connected to the opposing substrate 14 at a display device inner part not shown in the drawings.

In FIG. 1, the source IC 8 is a circuit for receiving an image display data signal inputted via the terminal row 9 from an externally connected device not shown in the drawing, to be supplied to the data bus lines 10. With regard to the source IC 8, a transistor circuit chip formed on a substrate different from the insulating substrate 3 is COG-mounted (Chip On Glass) on the insulating substrate 3.

Description of Operation

In order to handle bidirectionality, the scanning circuit 2 of the present exemplary embodiment performs two types of operations, a forward shift and a reverse shift.

Figure 7:
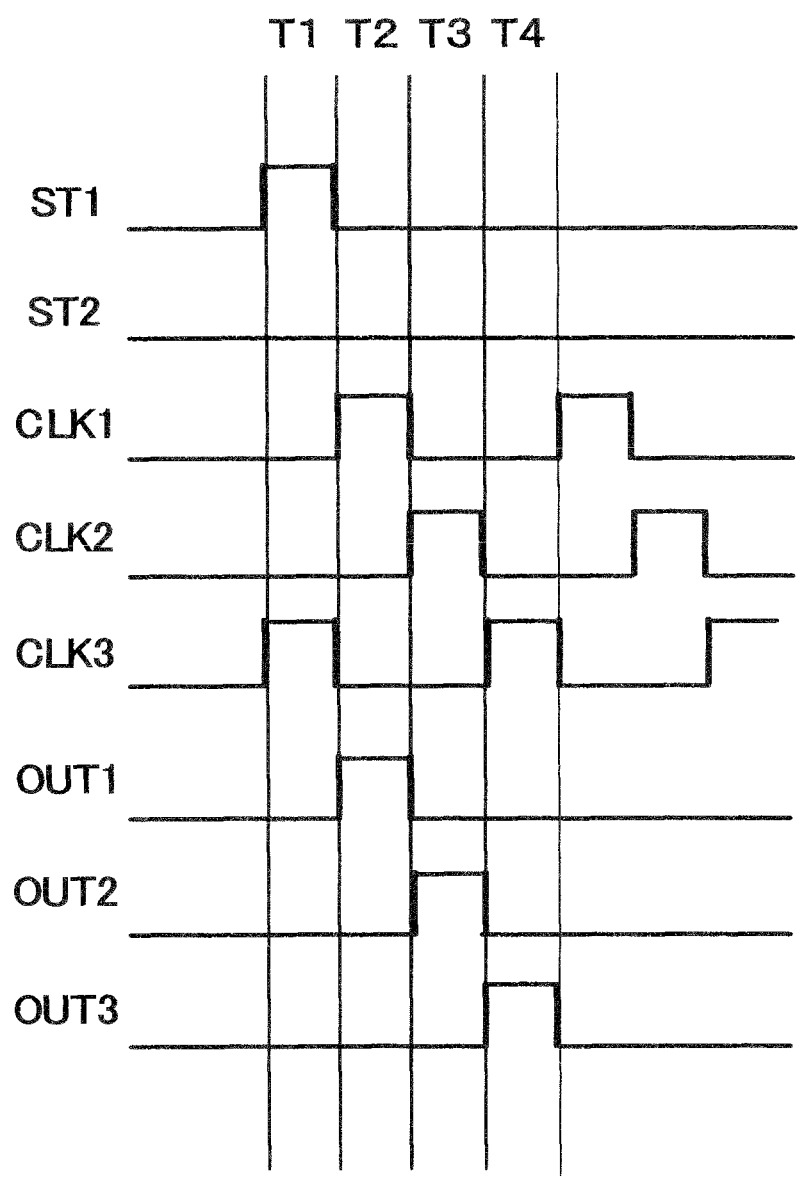
FIG. 7 is a timing chart showing operation of the scanning circuit for a forward shift according to the first exemplary embodiment of the invention.

First, operation of the forward shift is described. The forward shift represents an operation of transferring from top to bottom in the drawing of FIG. 3. A timing chart for the forward shift is shown in FIG. 7.

The forward shift holds a state in which FW is at a high level, and a state in which RV is at a low level, respectively. Therefore, inside the shift registers 1, Tr1 and Tr6, in which FW is connected to a gate, are in an ON state, and Tr2 and Tr8, to which RV is connected, are in an OFF state.

A start signal for the forward shift uses ST1. Start timing is at period T1 in FIG. 7, and in the period T1, ST1 holds a high level. On the other hand, ST2 holds a low level. When ST1 at a high level is applied to the IN(n−1) terminal of a first shift register 1 (SR1), Tr3 transits to an ON state, and a low level is applied to the node A. In addition, since Tr7 is also in an ON state at the same time, a high level (in actuality, a voltage obtained by lowering a high level potential by a Tr7 threshold voltage component) is inputted to the node B.

Next, in period T2, when ST1 transits to a low level, and CLK1 transits from a low level to a high level, potential of the node B rises, due to a bootstrap effect, and is outputted to OUT, without the CLK1 high level potential lowering. Here, since a signal of OUT1 (OUT of a first shift register 1 SR1) is connected to a gate bus line 7 (G1), potential of G1 also transits to a high level.

In addition, in period T3, when CLK1 transits from a high level to a low level, OUT1 also transits to a low level. Here, since a signal of CLK2 from R1 of the switch array 30 (SA1) is transferred to Tr4 via the REF terminal, the node A transits to a high level (in actuality, a voltage obtained by lowering a high level potential by a Tr4 threshold voltage component). Therefore, Tr10 is in an ON state, and potential of OUT and the gate bus line 7 (G1) are held to VSS (reset state).

Next, operation of a (second stage) shift register 1 (SR2) is described. Since an OUT signal outputted by the (first stage) shift register 1 (SR1) in period T2 is branched and connected to IN(n−1) of the second stage shift register 1 (SR2), Tr3 and Tr7 of the second stage shift register 1 (SR2) are both in an ON state, and perform an operation similar to the abovementioned first stage shift register 1 (SR1). In the period T3, CLK2 at a high level is outputted to OUT2 (OUT of second stage shift register SR2), without potential lowering Since OUT2 is connected to the gate bus line 7 (G2), it transits to a high level, similar to G1.

In addition, in period T4, since a signal of CLK3 outputted from R2 of the switch array 30 (SA1) is transferred to Tr4 via the REF terminal, since the node A transits to a high level (in actuality, a voltage obtained by lowering a high level potential by a Tr4 threshold voltage component), Tr10 is in an ON state, and potential the gate bus line 7 (G2) and OUT2 are held to VSS (reset state).

In this way, sequential output and transfer operation are repeated up to OUT (gate bus line 7 (Gn)) of the n-stage shift register 1 (SRn)

Figure 8:
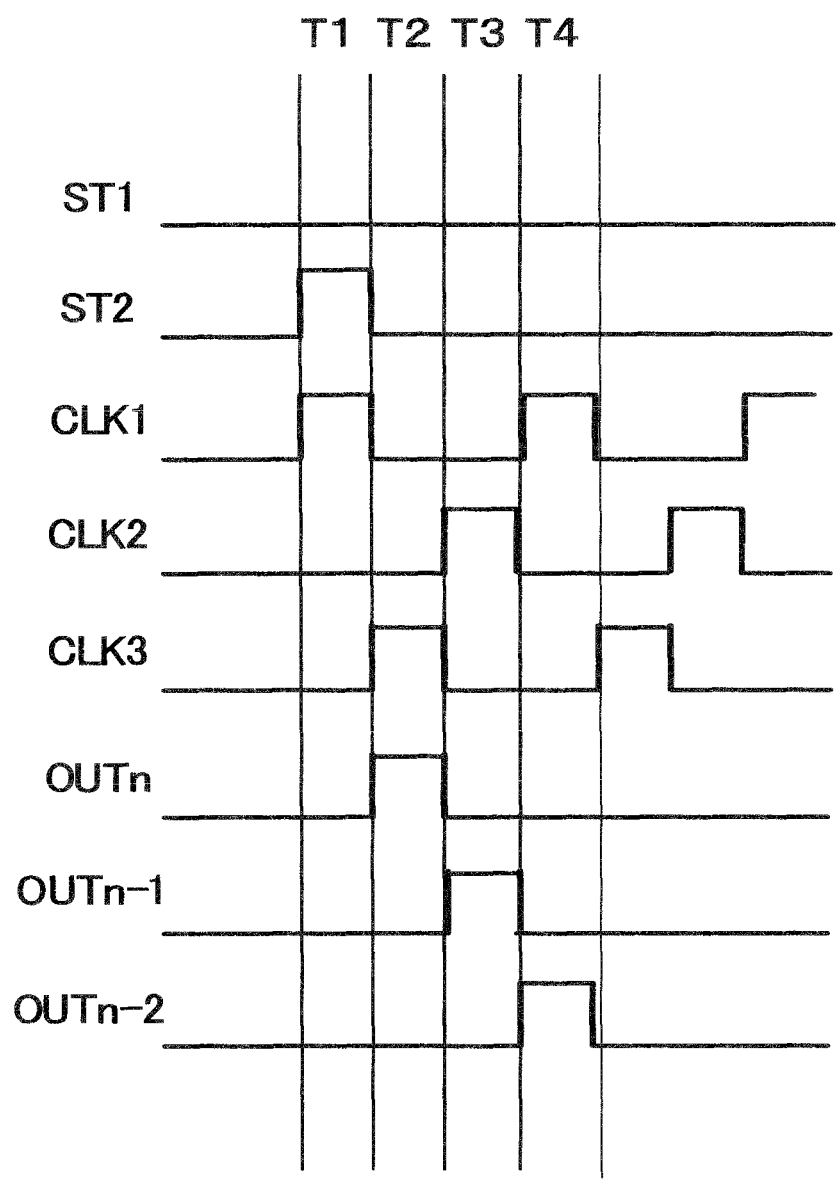
FIG. 8 is a timing chart showing operation of the scanning circuit for a reverse shift according to the first exemplary embodiment of the invention.

Next, operation of a reverse shift is described. The reverse shift represents an operation of transferring from bottom to top in the drawing of FIG. 3. A timing chart for reverse scanning is shown in FIG. 8.

The reverse shift holds each of a state in which FW is at a low level, and a state in which RV is at a high level. Therefore, inside the shift registers 1, Tr1 and Tr6, in which FW is connected to a gate, are in an OFF state, and Tr2 and Tr8, to which RV is connected, are in an ON state.

A start signal for the reverse shift uses ST2. Start timing is period T1 in FIG. 8, and in this period, ST2 holds a high level. On the other hand, ST1 holds a low level. When ST2 at a high level is applied to the IN(n+1) terminal of n-stage shift register 1 (SRn), Tr3 transits to an ON state, and a low level is applied to the node A. In addition, since Tr9 is also in an ON state at the same time, a high level (in actuality, a voltage obtained by lowering a high level potential by a Tr9 threshold voltage component) is inputted to the node B.

Next, in period T2, when ST2 transits to a low level, and CLK3 transits from a low level to a high level, potential of the node B rises, due to a bootstrap effect, and is outputted to OUT, without the CLK3 high level potential lowering. Here, since the OUT signal is connected to the gate bus line 7 (Gn), potential of Gn transits to a high level.

In addition, in period T3, when CLK3 transits from a high level to a low level, OUT also transits to a low level. Here, since a signal of CLK3 from R6 of the switch array 30 (SAm) is transferred to Tr4 via the REF terminal, the node A transits to a high level (in actuality, a voltage obtained by lowering a high level potential by the Tr4 threshold voltage component). Therefore, Tr10 is in an ON state, and potential of the gate bus line 7 (Gn) and OUT is held to VSS (reset state).

Next, operation of a (n−1)-stage shift register 1 (SRn−1) is described. Since an OUT signal outputted by the shift register 1 (SRn) in the period T2 is branched and connected to IN(n+1) of the shift register 1 (SRn−1), Tr3 and Tr9 of the (n−1)-stage shift register 1 (SRn−1) are both in an ON state, perform an operation similar to the abovementioned n-stage shift register 1 (SRn), and in the period T3, CLK2 at a high level is outputted to OUT, without potential lowering. Since OUT is connected to the gate bus line 7 (Gn−1), it transits to a high level, similar to Gn.

In addition, in period T4, since a signal of CLK1 outputted from R5 of the switch array 30 (SAm-1) is transferred to Tr4 via the REF terminal, the node A transits to a high level (in actuality, a voltage obtained by lowering a high level potential by a Tr4 threshold voltage component). Therefore, Tr10 is in an ON state, and potential of OUT is held to VSS (reset state).

In this way, sequential output and transfer operation are repeated in a cascade fashion up to OUT (gate bus line 7 (G1)) of the first stage shift register 1 (SR1).

When the gate bus line 7 transit to a high level, by an output signal of the scanning circuit 2 in the forward shift or the reverse shift, as described above, among pixel groups of the display section 4, all pixels connected to the gate bus lines 7 are in an active state. On the other hand, an image signal outputted from an externally connected device, not shown in the drawing, is transferred to data bus lines 10 via the source IC 8. In this state, an image signal transferred from the corresponding data bus line(s) 10 is inputted to the active pixel group. In each pixel, transmittance of a light source, not shown in the drawings, is controlled according to an inputted image signal.

In this way, by selecting all the gate bus lines 7 (G1~Gn) within one frame period, and inputting to each pixel image signals corresponding to pixels connected to each gate bus line 7, it is possible to change a display state of each pixel within the one frame period. Therefore, with regard to the display section 4, by changing the display state for each one frame period, it is possible to realize functionality of a display device.

The display device of the present exemplary embodiment as above is provided with the scanning circuit 2 on a side of the display section 4, and this scanning circuit 2 is configured from a plurality of shift registers 1 and switch arrays 30. In such cases, by providing the switch arrays 30, circuit configuration of the shift registers 1 is simplified. Therefore, even if pixel pitch and length in a longitudinal direction of the drawing of the shift registers 1 are shortened, accompanying higher resolution of the display section 4, it is possible to avoid a problem in which the frame-edge (margin) of the display device (equivalent to a length in a lateral direction of the drawing) becomes large.

Furthermore, the bidirectional shift register of the present exemplary embodiment sets the node A to a high level potential for each one clock cycle in the REF terminal (reset state). Therefore, it is possible to curtail potential variations due to transistor leakage, noise, or the like, and it is possible to realize a bidirectional scanning circuit in which a circuit malfunction due to potential variations is prevented, or a display device using the scanning circuit.

Second Exemplary Embodiment

Figure 9:
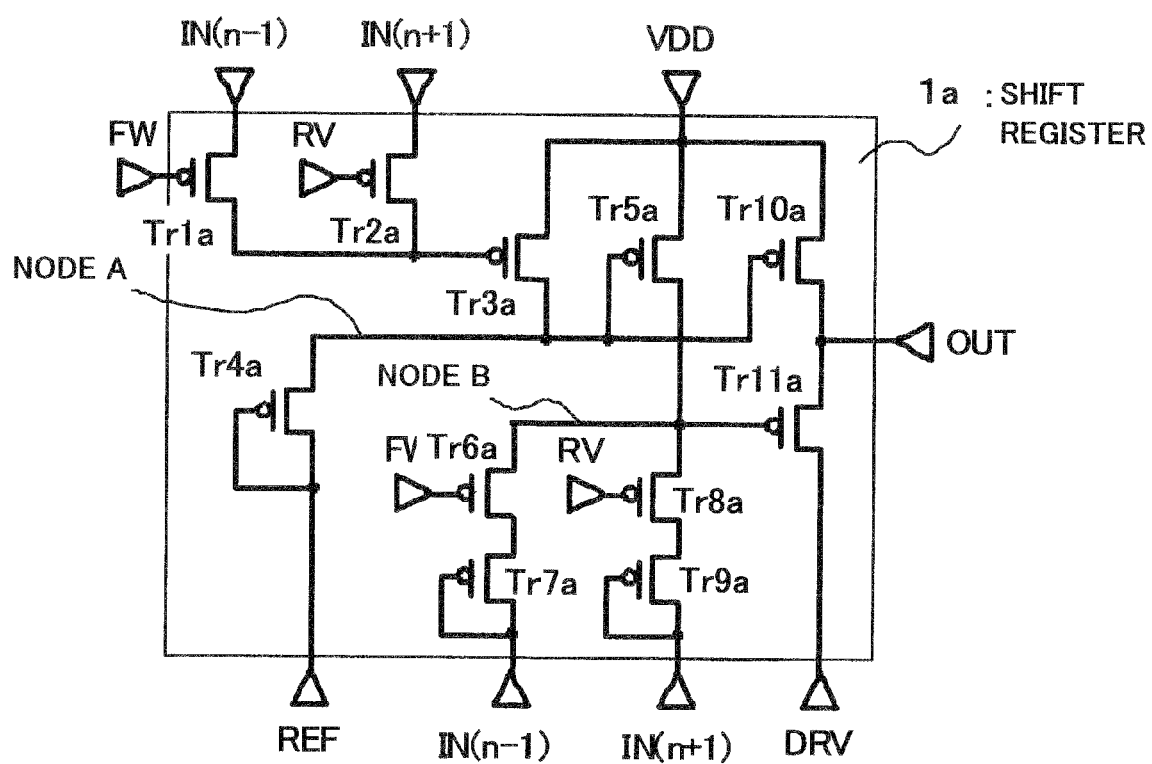
FIG. 9 is a circuit diagram showing a configuration of a shift register according to a second exemplary embodiment of the invention.
Figure 10:
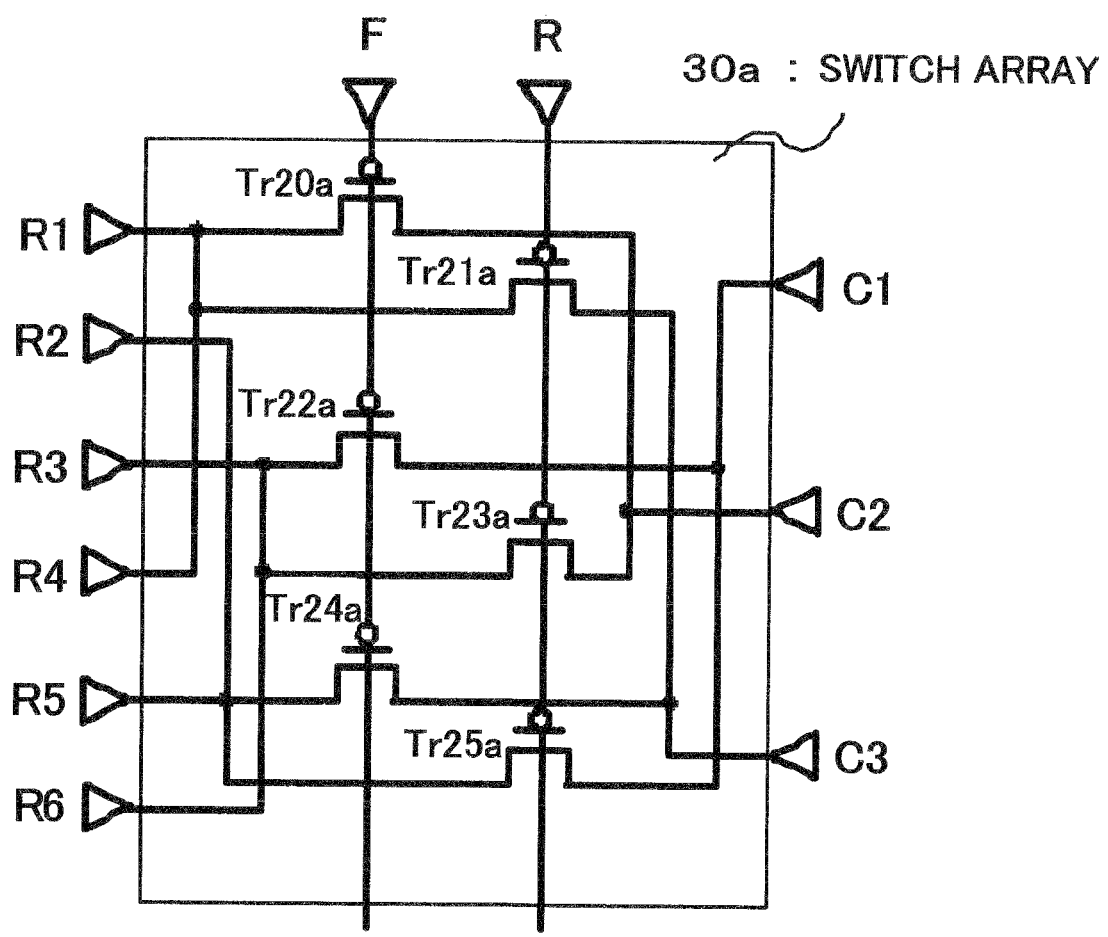
FIG. 10 is a circuit diagram showing a configuration of a switch array according to the second exemplary embodiment of the invention.

A display device according to a second exemplary embodiment of the present invention, as shown in FIG. 9 and FIG. 10, is similar to configurations shown in FIG. 1 and FIG. 2. However, switch transistors in pixels composing the display section 4 are PMOS transistors 13a as shown in FIG., 11. Furthermore, as shown in FIG. 9, all transistors Tr1a~Tr11a composing the shift register 1 of FIG. 4 in the first exemplary embodiment and all transistors Tr20a~Tr25a composing the switch array 30a of FIG. 10 are PMOS transistors. In addition, VDD is connected instead of VSS. Connection configuration is similar to the first exemplary embodiment.

Figure 12:
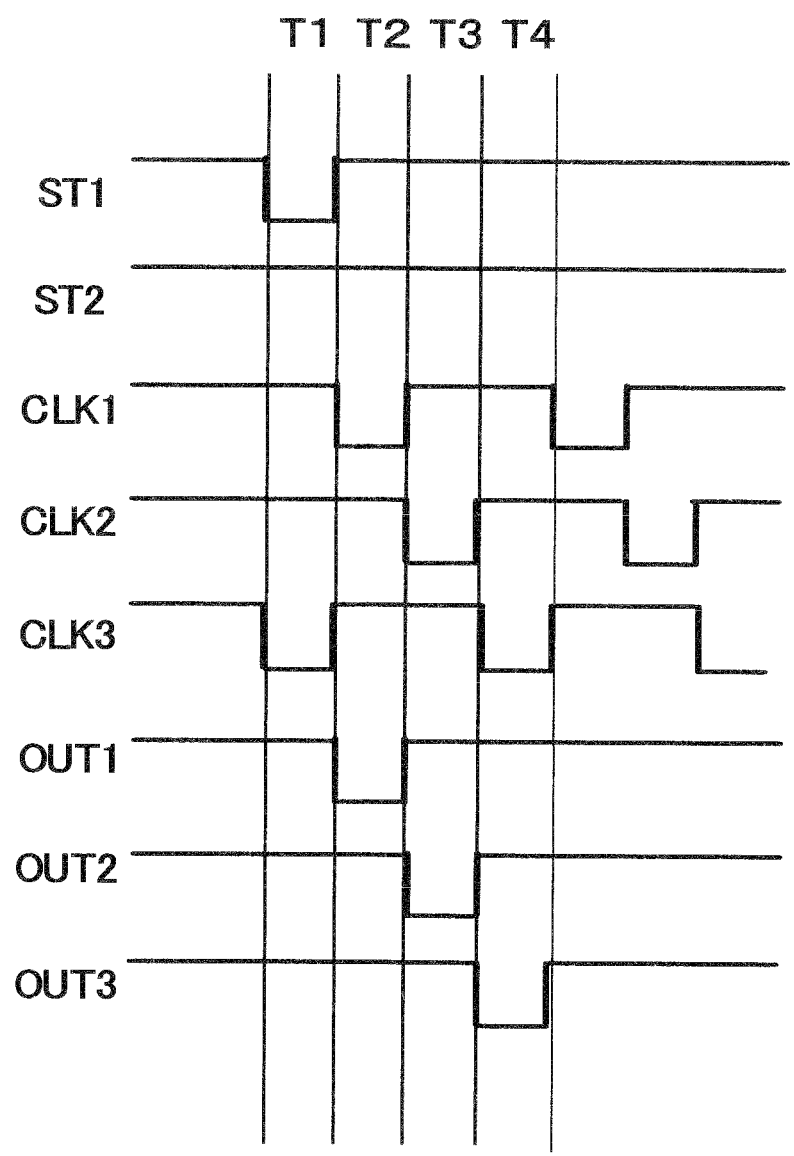
FIG. 12 is a timing chart for a forward shift of a scanning circuit according to the second exemplary embodiment of the invention.
Figure 13:
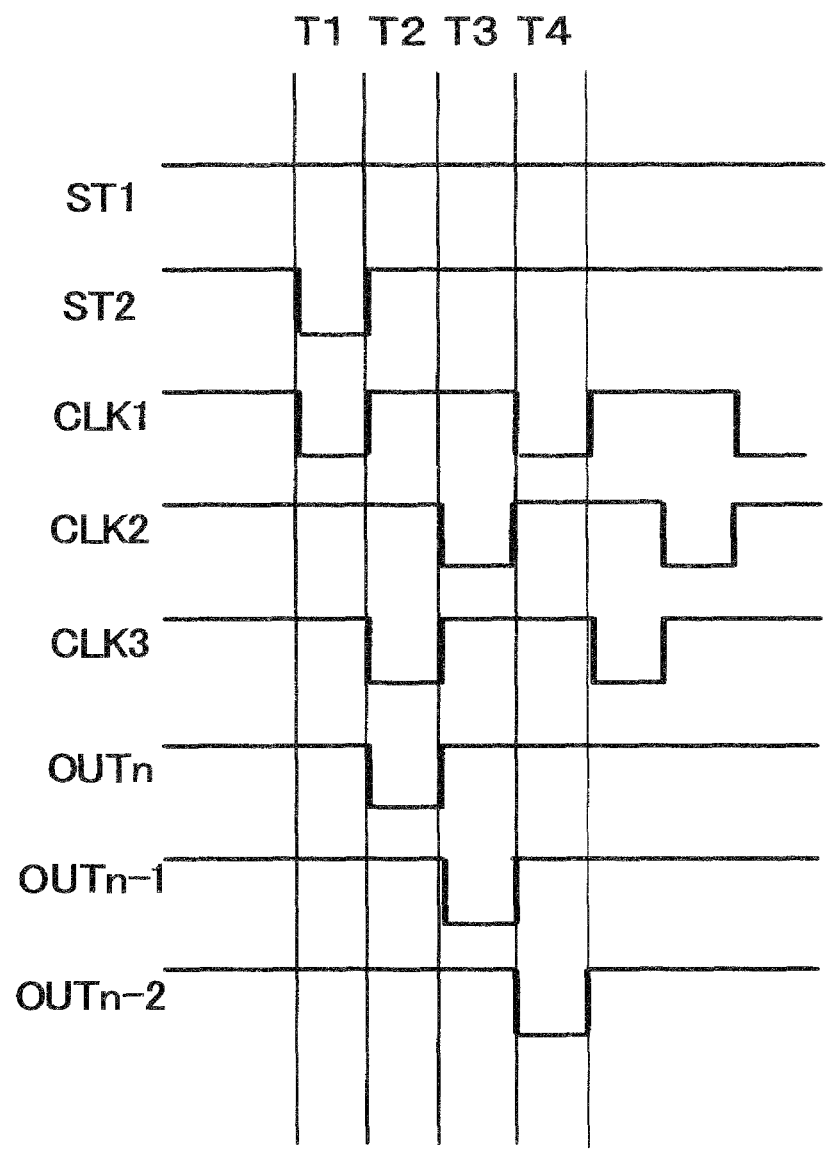
FIG. 13 is a timing chart for a reverse shift of the scanning circuit according to the second exemplary embodiment of the invention.

The shift register(s) and switch array configured as above operate similarly to those described in the first exemplary embodiment. However, levels of all signals shown in FIG. 12 and FIG. 13 are the inverse of levels of signals shown in FIG. 7 and FIG. 8, respectively.

As described above, in cases in which PMOS transistors are used as in the present exemplary embodiment, by providing the switch array 30a similarly to the first exemplary embodiment, circuit configuration of the shift registers 1 is simplified. Therefore, even if pixel pitch and length in a longitudinal direction of the drawing of the shift registers 1 are shortened, accompanying higher resolution of the display section 4, it is possible to avoid a problem in which the frame-edge (margin) of the display device (equivalent to length in a lateral direction of the drawing) becomes large.

Third Exemplary Embodiment

The display device according to a third exemplary embodiment of the present invention is similar to configurations shown in FIG. 1 and FIG. 2. Furthermore, similar circuits are applied to the shift registers of the first exemplary embodiment shown in FIG. 4 and the pixel portion shown in FIG. 6. In the present exemplary embodiment, the fact that a scanning circuit operates by four phase clock signals (CLK1, CLK2, CLK3, CLK4) is different from the first exemplary embodiment.

Figure 14:
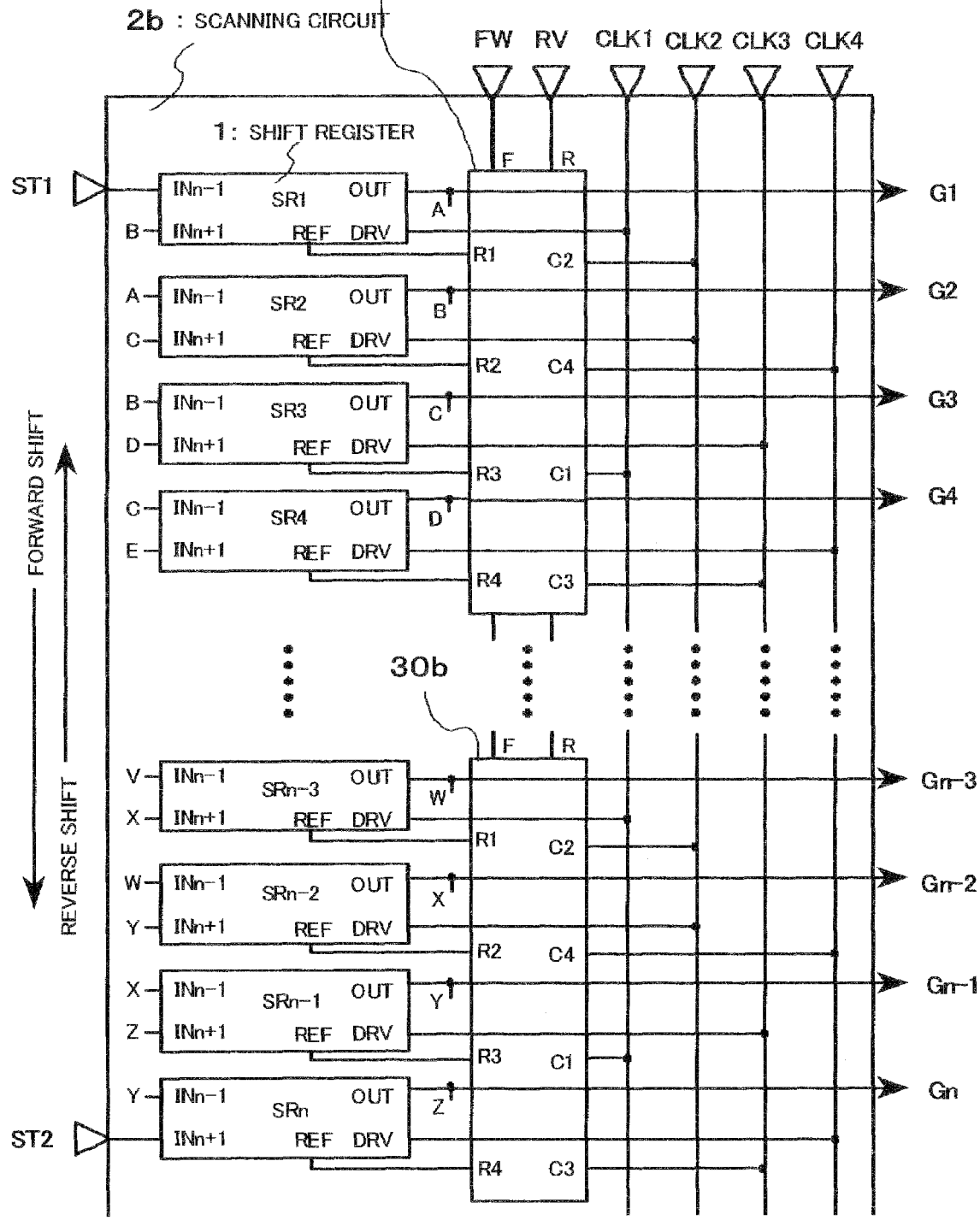
FIG. 14 is a block diagram showing a configuration of a scanning circuit according to a third exemplary embodiment of the invention.

FIG. 14 is a drawing showing a configuration of a scanning circuit according to the third exemplary embodiment of the present invention. In FIG. 14, the scanning circuit 2b is composed of a plurality of shift registers 1 (unit registers represented by SR1, SR2, ... SRn), a plurality of switch arrays 30b (SA1, ... SAm), and line groups (lines connected to terminals CLK1, CLK2, CLK3, CLK4, ST1, ST2, FW, and RV). Gate bus lines 7 are connected to OUT terminals of each of the shift registers 1 of the scanning circuit 2b, and signals from the OUT terminals of the shift registers 1 are transferred to the connected gate bus lines 7.

Figure 15:
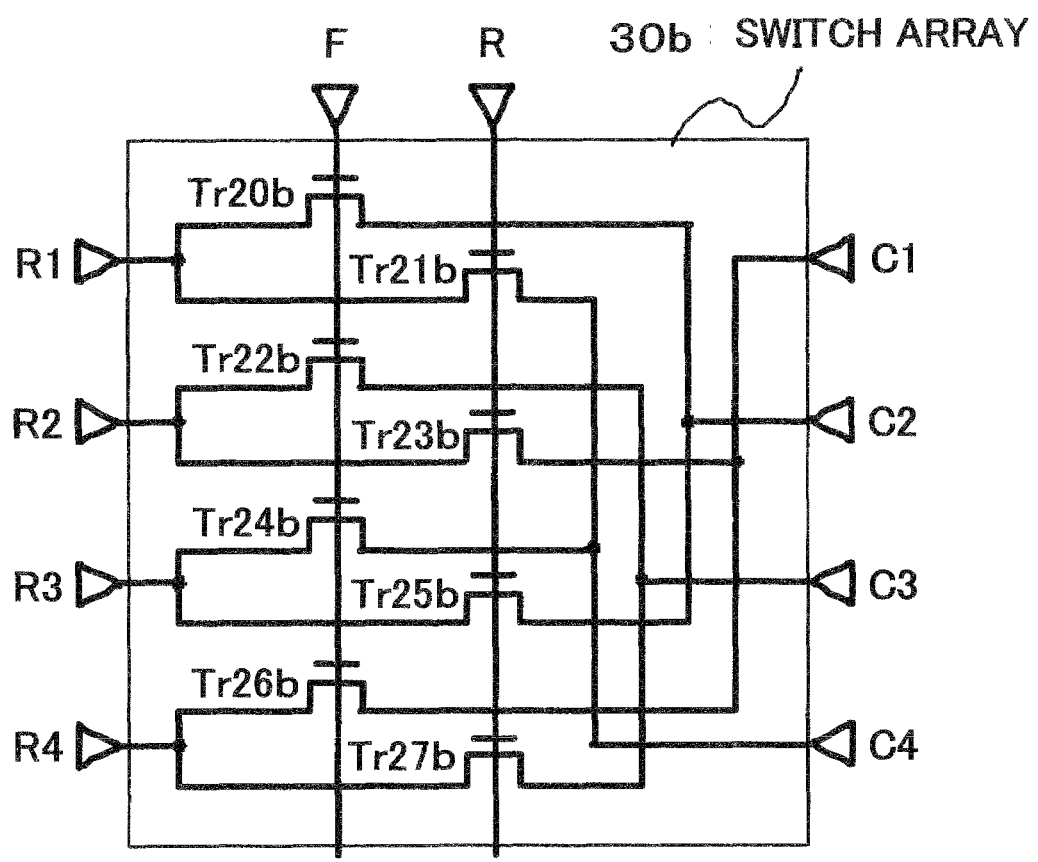
FIG. 15 is a circuit diagram showing a configuration of a switch array according to the third exemplary embodiment of the invention.

FIG. 15 is a circuit diagram of a switch array according to the present third exemplary embodiment. In FIG. 15, the switch array 30b is provided with NMOS transistors Tr20b~Tr27b, and terminals F, R, C1~C4, R1~R4. F (FW) is connected to respective gates of Tr20b, Tr22b, Tr24b, and Tr26b. R (RV) is connected to respective gates of Tr21b, Tr23b, Tr25b, and Tr27b. One end of Tr23b and of Tr26b, one end of Tr20b and of Tr25b, one end of Tr22b and of Tr27b, and one end of Tr21b and of Tr24b are respectively connected to C1~C4. The other end of Tr20b and of Tr21b, the other end of Tr22b and of Tr23b, the other end of Tr24b and of Tr25b, and the other end of Tr26b and of Tr27b are respectively connected to R1~R4. C1~C4 are respectively supplied with clock signals CLK1~CLK4. Furthermore, REF terminals of four shift registers 1 lined up in a forward direction are respectively connected to R1~R4. Each transistor is controlled to be in an ON state or an OFF state by F or R. In the configuration of FIG. 14, length in a longitudinal direction of a switch array 30b is equivalent to four shift registers 1.

By installing this type of switch array 30b, similar to the first exemplary embodiment, an element circuit for setting a node A of the shift register shown in FIG. 4 to a high level is diode-connected Tr4 only, and in comparison to conventional technology, a reduction of three transistors is possible. Furthermore, the switch array 30b is laid out over a plurality (stages) of shift registers 1. As a result, since it is possible to ensure a long space in a longitudinal direction, it is possible to shorten width in a lateral direction. Therefore, a frame-edge (margin) width of the display device (length in lateral direction in FIG. 1) can be made short. According to this switch array 30b, since a clock signal supplied to the REF terminal of each of the shift registers 1 can be collectively switched and transferred by this switch array 30b, relatively simplified circuits can be applied to the shift registers 1.

Description of Operation

Since the scanning circuit 2b of the present exemplary embodiment, similar to the first exemplary embodiment or the second exemplary embodiment, handles bidirectionality, two types of operation, forward shift and reverse shift are performed.

Figure 16:
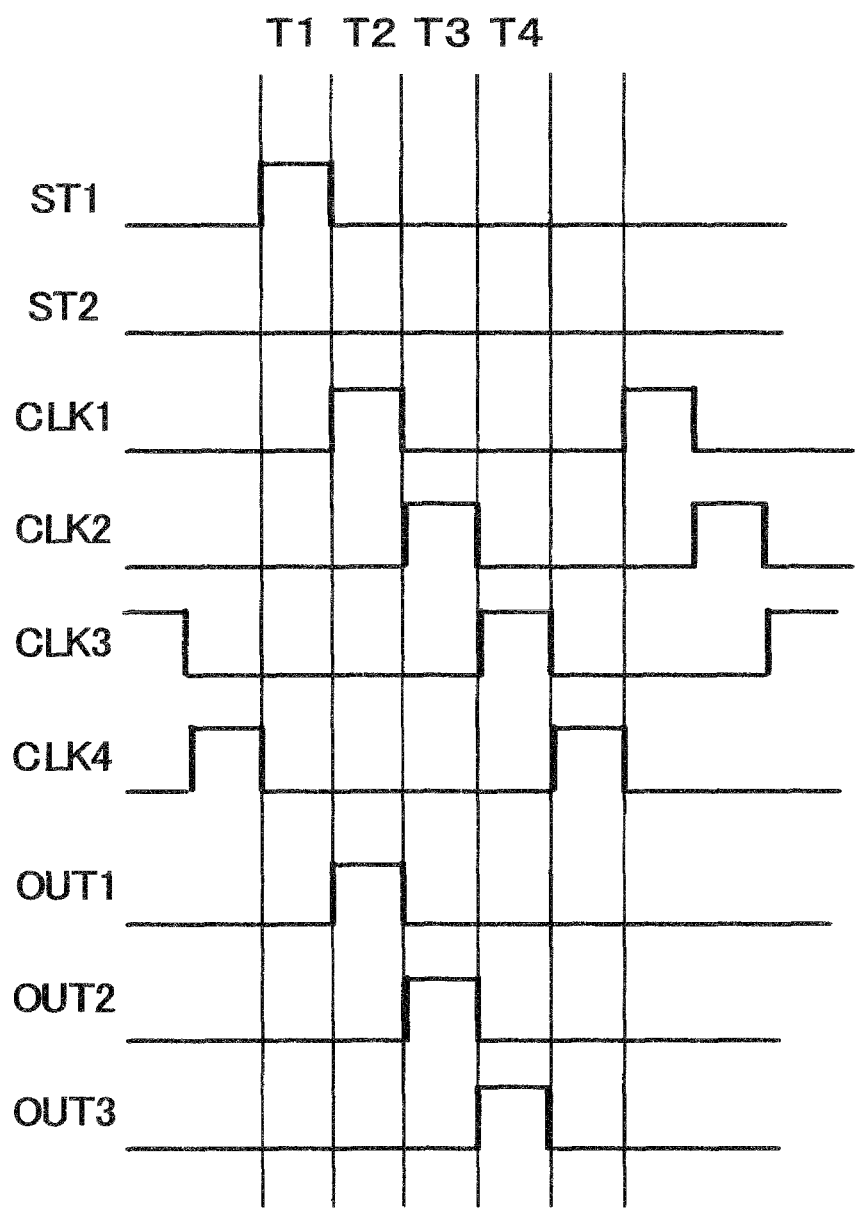
FIG. 16 is a timing chart for a forward shift of a scanning circuit according to the third exemplary embodiment of the invention.

First, operation of the forward shift is described. The forward shift represents an operation of transferring from top to bottom in the drawing of FIG. 14. A timing chart for the forward shift is shown in FIG. 16.

The forward shift holds a state in which FW is at a high level, and a state in which RV is at a low level, respectively. Therefore, inside the shift registers 1, Tr1 and Tr6, in which FW is connected to a gate, are in an ON state, and Tr2 and Tr8, to which RV is connected, are in an OFF state.

A start signal for the forward shift uses ST1. Start timing is period T1 in FIG. 16, and in the period T1, ST1 supports a high level. On the other hand, ST2 holds a low level. When ST1 at a high level is applied to the IN(n−1) terminal of shift register 1 (SR1), Tr3 transits to an ON state, and a low level is applied to node A. In addition, since Tr7 is also in an ON state at the same time, a high level (in actuality, a voltage obtained by lowering a high level potential by a Tr7 threshold voltage component) is inputted to the node B.

Next, in period T2, when ST1 transits to a low level, and CLK1 transits from a low level to a high level, potential of the node B rises, due to a bootstrap effect, and is outputted to OUT, without the CLK1 high level potential lowering. Here, since a signal of OUT1 (OUT of the shift register 1 SR1) is connected to a gate bus line 7 (G1), potential of G1 also transits to a high level.

In addition, in period T3, when CLK1 transits from a high level to a low level, OUT1 also transits to a low level. Here, since a signal of CLK2 from R1 of the switch array 30b (SA1) is transferred to Tr4 via the REF terminal, the node A transits to a high level (in actuality, a voltage obtained by lowering a high level potential by a Tr4 threshold voltage component). Therefore, Tr10 is in an ON state, and potential of OUT1 and the gate bus line 7 (G1) are held to VSS (reset state).

Next, operation of a (second stage) shift register 1 (SR2) is described. Since an OUT signal outputted by the (first stage) shift register 1 (SR1) in period T2 is branched and connected to IN(n−1) of the second stage shift register 1 (SR2), Tr3 and Tr7 of the second stage shift register 1 (SR2) are both in an ON state, and perform an operation similar to the abovementioned first stage shift register 1 (SR1). In the period T3, CLK2 at a high level is outputted to OUT2 (OUT of second stage shift register SR2), without potential lowering. Since OUT2 is connected to the gate bus line 7 (G2), it transits to a high level, similar to G1.

In addition, in period T4, since a signal of CLK3 outputted from R2 of the switch array 30b (SA1) is transferred to Tr4 via the REF terminal, since the node A transits to a high level (in actuality, a voltage obtained by lowering a high level potential by a Tr4 threshold voltage component), Tr10 is in an ON state, and potential of the gate bus line 7 (G2) and OUT2 are held to VSS (reset state).

In this way, sequential output and transfer operation are repeated up to OUT (gate bus line 7 (Gn)) of the n-stage shift register 1 (SRn).

Figure 17:
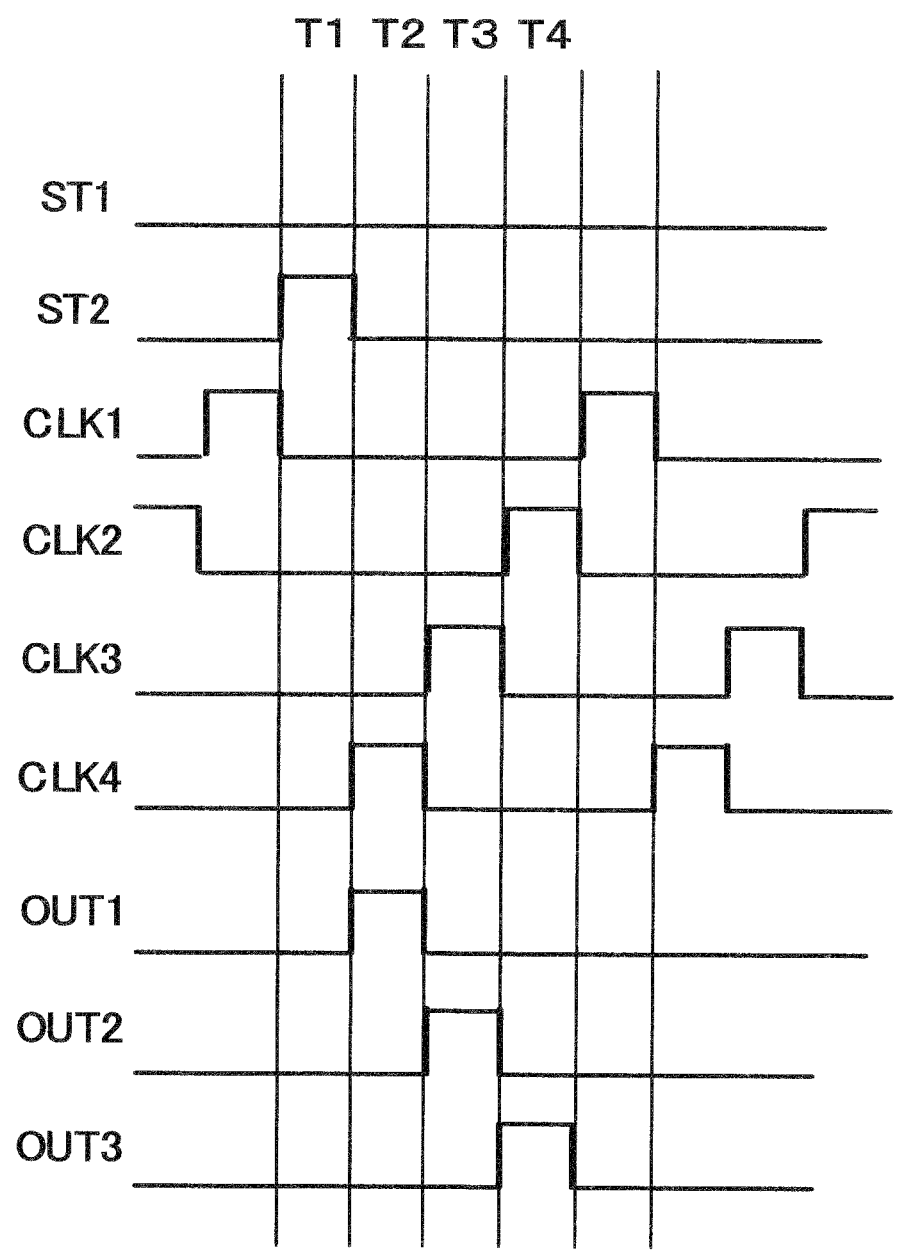
FIG. 17 is a timing chart for a reverse shift of a scanning circuit according to the third exemplary embodiment of the invention.

Next, operation of a reverse shift is described. The reverse shift represents an operation of transferring from bottom to top in the drawing of FIG. 14. A timing chart for reverse scanning is shown in FIG. 17.

The reverse shift holds each of a state in which FW is at a low level, and a state in which RV is at a high level. Therefore, inside the shift registers 1, Tr and Tr6, in which FW is connected to a gate, are in an OFF state, and Tr2 and Tr8, to which RV is connected, are in an ON state.

A start signal for the reverse shift uses ST2. Start timing is period T1 in FIG. 17, and in this period, ST2 holds a high level. On the other hand, ST1 holds a low level. When ST2 at a high level is applied to the IN(n+1) terminal of n-stage shift register 1 (SRn), Tr3 transits to an ON state, and a low level is applied to the node A. In addition, since Tr9 is also in an ON state at the same time, a high level (in actuality, a voltage obtained by lowering a high level potential by a Tr9 threshold voltage component) is inputted to the node B.

Next, in period T2, when ST2 transits to a low level, and CLK4 transits from a low level to a high level, potential of the node B rises, due to a bootstrap effect, and is outputted to OUT, without the CLK4 high level potential lowering. Here, since the OUT signal is connected to the gate bus line 7 (Gn), potential of Gn transits to a high level.

In addition, in period T3, when CLK3 transits from a high level to a low level, OUT also transits to a low level. Here, since a signal of CLK3 from R4 of the switch array 30b (SAm) is transferred to Tr4 via the REF terminal, the node A transits to a high level (in actuality, a voltage obtained by lowering a high level potential by a Tr4 threshold voltage component). Therefore, Tr10 is in an ON state, and potential of the gate bus line 7 (Gn) and OUT are held to VSS (reset state).

Next, operation of a shift register 1 (SRn−1) is described. Since an OUT signal outputted by the n-stage shift register 1 (SRn) in the period T2 is branched and connected to IN(n+1) of the (n−1)-stage shift register 1 (SRn−1), Tr3 and Tr7 of the (n−1)-stage shift register 1 (SRn−1) are both in an ON state, perform an operation similar to the abovementioned n-stage shift register 1 (SRn), and in the period T3, CLK3 at a high level is outputted to OUT, without potential lowering. Since OUT is connected to the gate bus line 7 (Gn−1), it transits to a high level, similar to Gn.

In addition, in period T4, since a signal of CLK2 outputted from R3 of the switch array 30b (SAm−1) is transferred to Tr4 via the REF terminal, the node A transits to a high level (in actuality, a voltage obtained by lowering a high level potential by a Tr4 threshold voltage component). Therefore, Tr10 is in an ON state, and potential of OUT is maintained to VSS (reset state).

In this way, sequential output and transfer operation are repeated up to OUT (gate bus line 7 (G1)) of the first stage shift register 1 (SR1).

As described above, in the present exemplary embodiment in cases of using a four clock system scanning circuit, it is possible to realize a scanning circuit that can obtain an effect equal to the first exemplary embodiment, and a display device using this scanning circuit.

Fourth Exemplary Embodiment

The display device according to a fourth exemplary embodiment of the present invention is similar to configurations shown in FIG. 1 and FIG. 2. In the present exemplary embodiment, configuration of a scanning circuit, shift registers, and switch arrays are different from the third exemplary embodiment.

Figure 18:
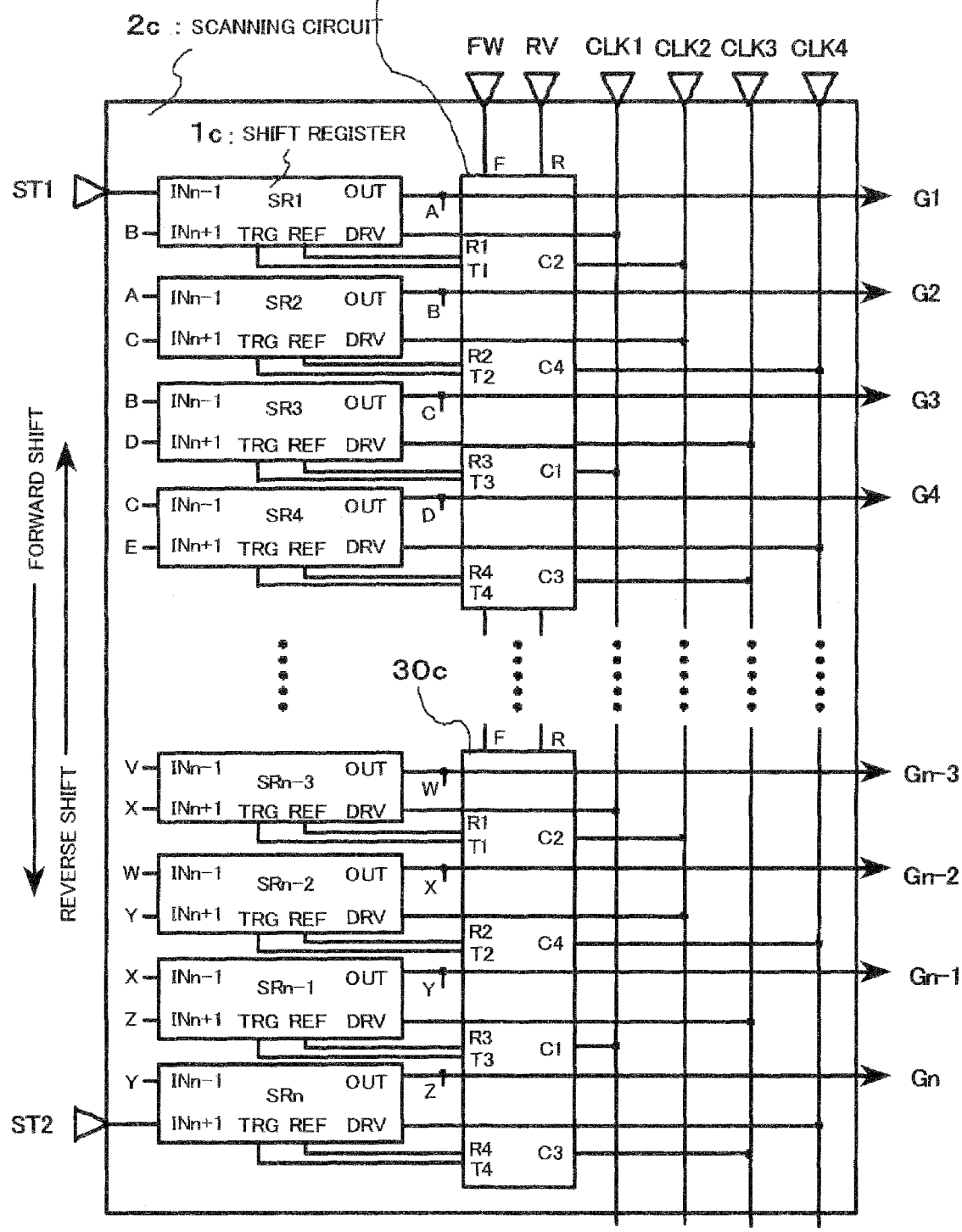
FIG. 18 is a block diagram showing a configuration of a scanning circuit according to a fourth exemplary embodiment of the invention.

FIG. 18 is a drawing showing a configuration of the scanning circuit according to the fourth exemplary embodiment of the present invention. In FIG. 18, the scanning circuit 2c is composed of a plurality of shift registers 1c (SR1, SR2, ... SRn), a plurality of switch arrays 30c (SA1, ... SAm), and line groups (CLK1, CLK2, CLK3, CLK4, ST1, ST2, FW, and RV). Gate bus lines 7 are connected to OUT terminals of each of the shift registers 1c of the scanning circuit 2c, and signals from the OUT terminals of the shift registers 1c are transferred to the connected gate bus lines 7.

In the third exemplary embodiment, a clock signal (corresponding to CLK2) of a phase subsequent to a clock signal (for example, CLK1) inputted to DRV is used in an operation of setting potential of a node A. In contrast to this, the present exemplary embodiment is applied to circuits in which clock signals (corresponding to CLK2 and CLK4) before and after a clock signal (for example, CLK1) inputted to DRV are used as signals for setting the node A and node B to an arbitrary potential.

Figure 19:
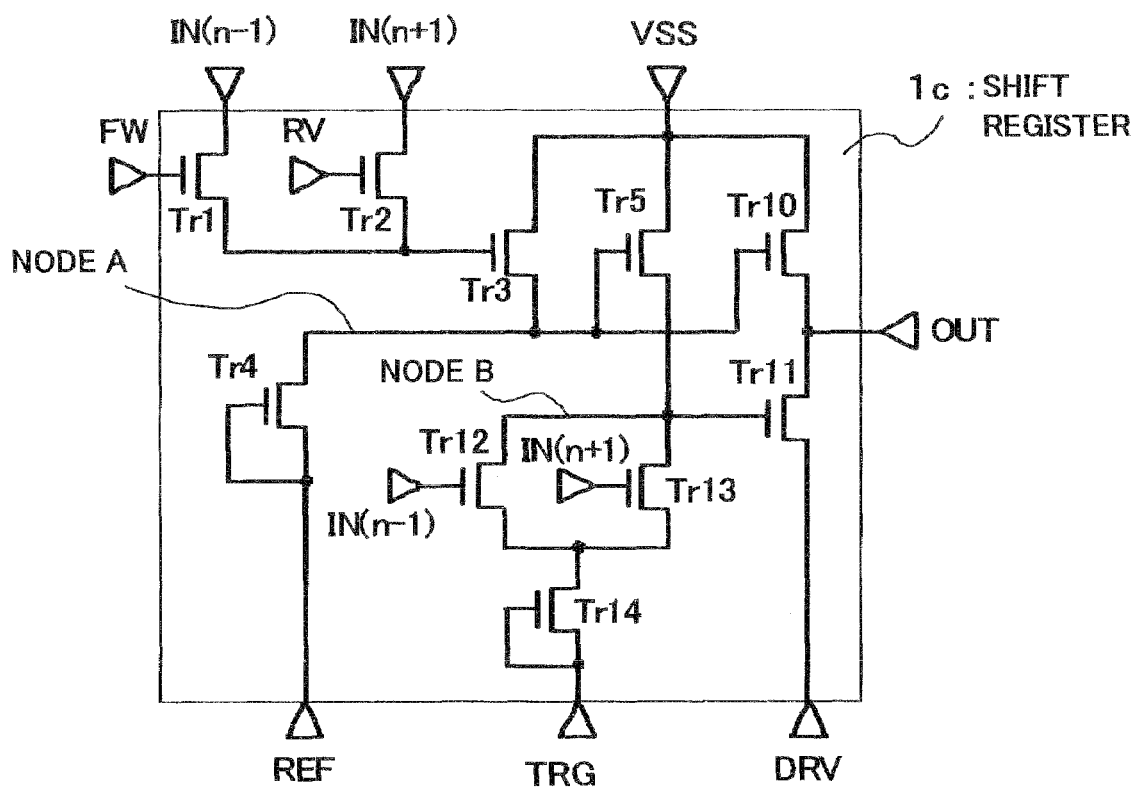
FIG. 19 is a circuit diagram showing a configuration of a shift register according to the fourth exemplary embodiment of the invention.

FIG. 19 is a circuit diagram showing a configuration of a shift register (unit register) according to the fourth exemplary embodiment of the present invention. In FIG. 19, reference symbols identical to FIG. 4 represent identical items, and descriptions thereof are omitted. Instead of the NMOS transistors Tr6~Tr9 of FIG. 4, the shift register 1c of FIG. 19 is provided with Tr12~Tr14. Furthermore, a terminal TRG is additionally provided.

In the NMOS transistor Tr12, a gate is connected to IN(n−1), a source is connected to a node B, and a drain is connected to a source of Tr14. A gate of the NMOS transistor Tr13 is connected to IN(n+1), a source is connected to the node B, and a drain is connected to the source of Tr14. Tr14 is diode-connected, and a drain is connected to TRG.

Here, among adjacent shift registers 1c, a signal from an OUT terminal of an upper shift register 1c is inputted to the IN(n−1) terminal. Furthermore, among adjacent shift registers 1c, a signal from an OUT terminal of a lower shift register 1c is inputted to IN(n+1). Furthermore, a signal of any of CLK1, CLK2, CLK3, and CLK4 is respectively inputted to the DRV terminal. Furthermore, a signal outputted from a switch array 30c is inputted to a TRG terminal and a REF terminal. Moreover, a control signal prescribing a scanning direction of the scanning circuit 2c is inputted to each of FW and RV. Furthermore, ST1 and ST2 are respectively inputted to IN terminals of an array (row) of the shift registers 1c, as start signals for starting transfer. Moreover, at an OUT terminal, a signal at a high level or a low level is outputted by an operation of a shift register 1c, and this signal is applied to a gate bus line 7. Finally, at VSS, a constant voltage equivalent to a low level signal is applied.

Figure 20:
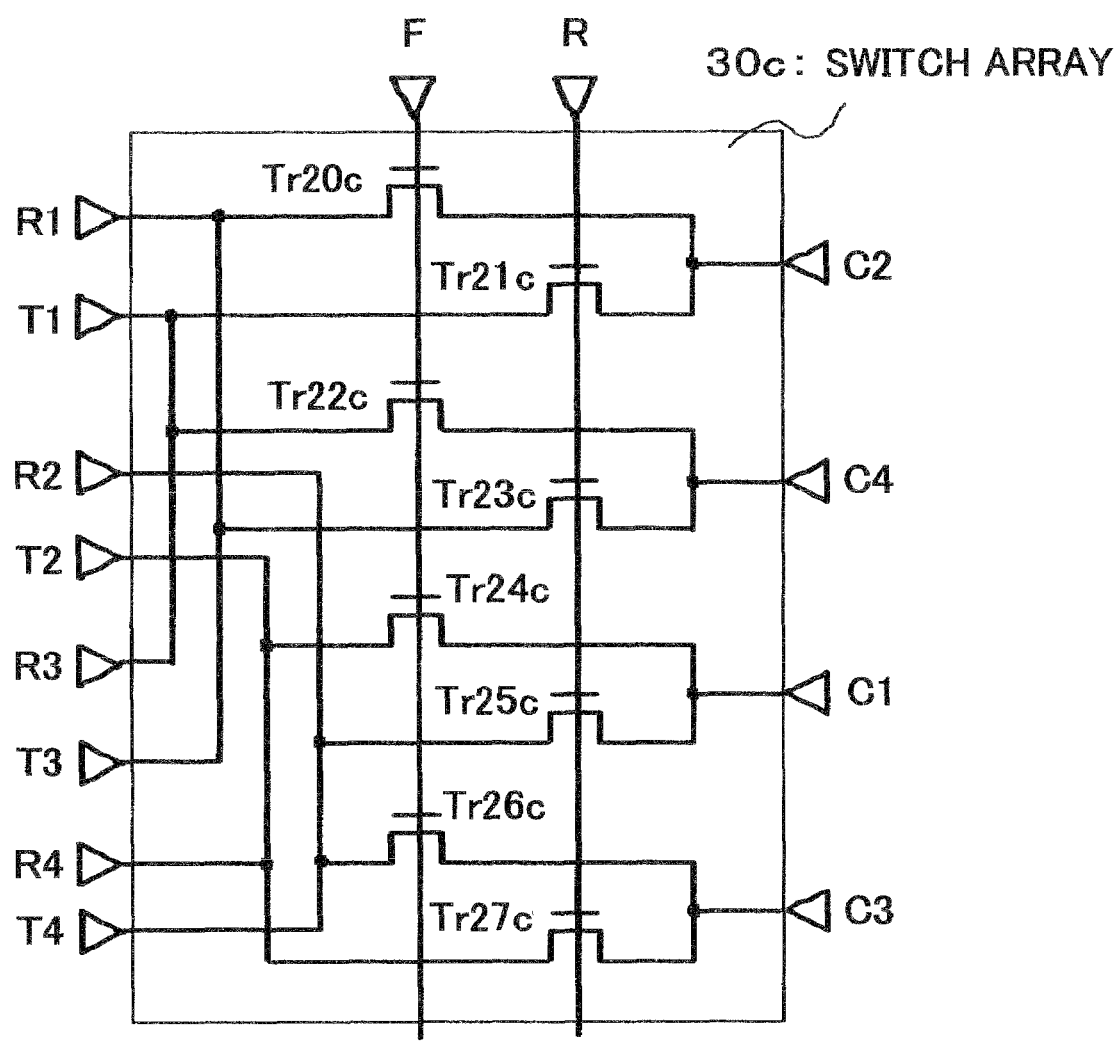
FIG. 20 is a circuit diagram showing a configuration of a switch array according to the fourth exemplary embodiment of the invention.

FIG. 20 is a circuit diagram of a switch array according to the present fourth exemplary embodiment. In FIG. 20, a switch array 30c is provided with NMOS transistors Tr20c~Tr27c, and terminals F, R, C1~C4, R1~R4, and T1~T4. F is connected to respective gates of Tr20c, Tr22c, Tr24c, and Tr26c. R is connected to respective gates of Tr21c, Tr23c, Tr25c, and Tr27c. One end of Tr24c and of Tr25c, one end of Tr20c and of Tr21c one end of Tr26c and of Tr27c, and one end of Tr22c and of Tr23c are respectively connected to C1~C4. The other end of Tr20c and of Tr23c, the other end of Tr25c and of Tr26c, the other end of Tr21c and of Tr22c, and the other end of Tr24c and of Tr27c are respectively connected to R1 and T3, R2 and T4, R3 and T1, and R4 and T2. C1~C4 are respectively supplied with clock signals CLK1~CLK4. Furthermore, REF terminals of respective shift registers 1c lined up in a forward direction are connected to R1~R4, and TRG terminals of respective shift registers 1c lined up in a forward direction are connected to T1~T4. Each transistor is controlled to be in an ON state or an OFF state by F or R. In the configuration of FIG. 18, length in a longitudinal direction of the drawing of a switch array 30c is equivalent to four shift registers 1c.

Figure 29:
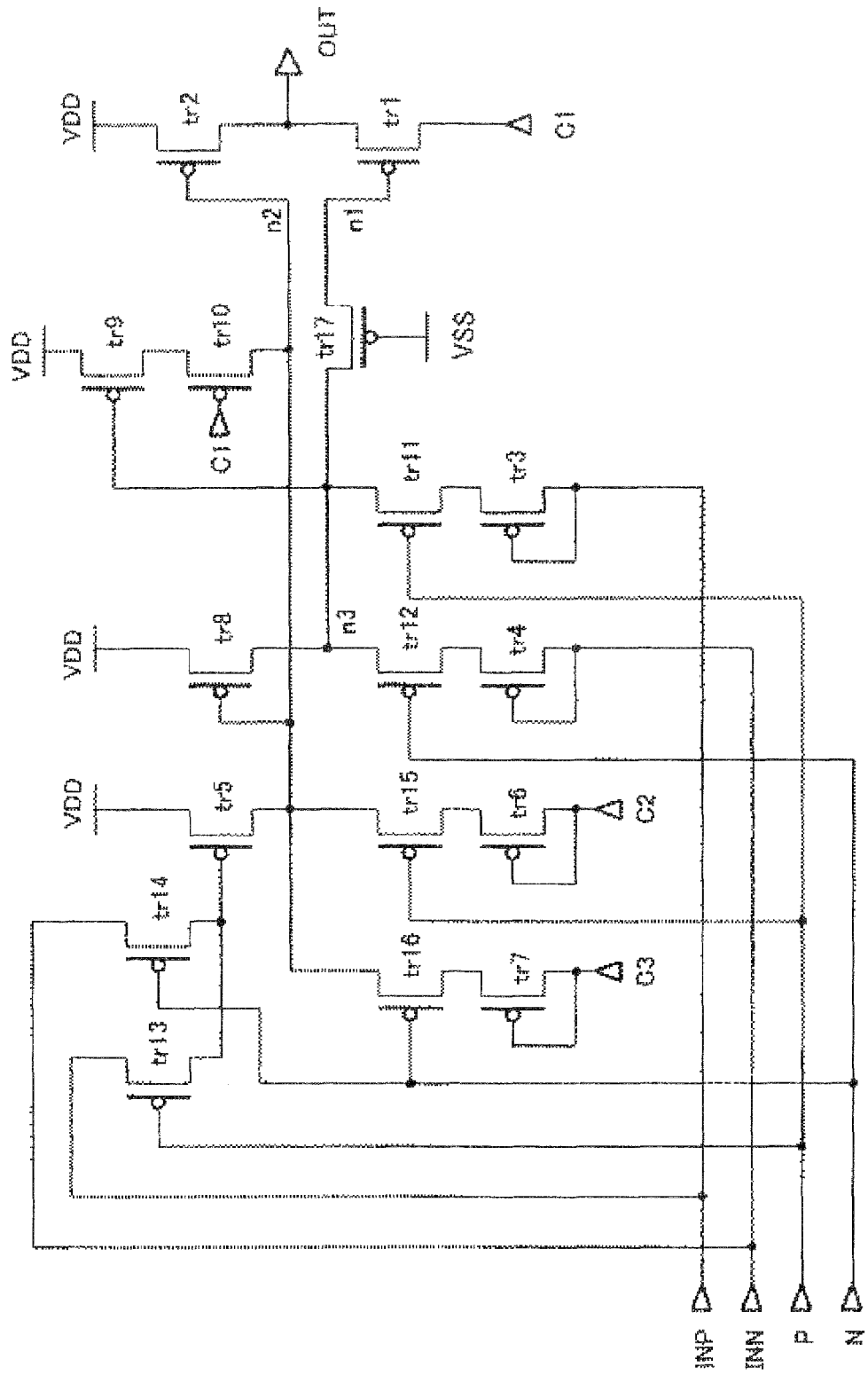
FIG. 29 is a circuit diagram showing one configuration of a three-phase bidirectional shift register of Patent Document 1.

By installing this type of switch array 30c, an element circuit for setting the node A of the shift register shown in FIG. 19 to a high level is diode-connected Tr4 only. In addition, the element circuit for setting the node B to a high level is configured of Tr12, Tr13, and Tr14. According to a circuit shown in Patent Document 1, an element circuit which drives an A node equivalent includes four transistors tr6, tr7, tr15, and tr16. In addition an element circuit which drives a B node equivalent includes four transistors tr3, tr4, tr11, and tr12. Therefore, according to the shift registers of the present exemplary embodiment, a reduction of 3+1=4 transistors, in comparison to a circuit shown in Patent Document 1 (FIG. 29 of instant application).

Furthermore, the switch array 30c is laid out over a plurality of shift registers 1c. As a result, since it is possible to ensure a long space in a longitudinal direction, it is possible to shorten width in a lateral direction. Therefore, a frame-edge (margin) width of the display device (length in lateral direction in FIG. 1) can be made short. According to this switch array 30c, since a clock signal supplied to the TRG terminal and REF terminal of each of the shift registers 1c can be collectively switched and transferred by this switch array 30c, relatively simplified circuits can be applied to the shift registers 1c.

Since the scanning circuit 2c of the present exemplary embodiment performs operations equivalent to the third exemplary embodiment (refer to FIG. 16 and FIG. 17), descriptions thereof are omitted.

In this way, in cases in which the present exemplary embodiment is applied to the four clock system scanning circuit, having a different configuration from the third exemplary embodiment, there is an effect equal to the first exemplary embodiment or the second exemplary embodiment.

As described above, according to the present exemplary embodiment, in cases of using the four clock system scanning circuit controlled by using clock signals before and after a clock signal used in output, it is possible to realize a display device using the scanning circuit that can obtain an effect equivalent to that described for the first exemplary embodiment or the like, or a display device using the scanning circuit.

Fifth Exemplary Embodiment

Figure 21:
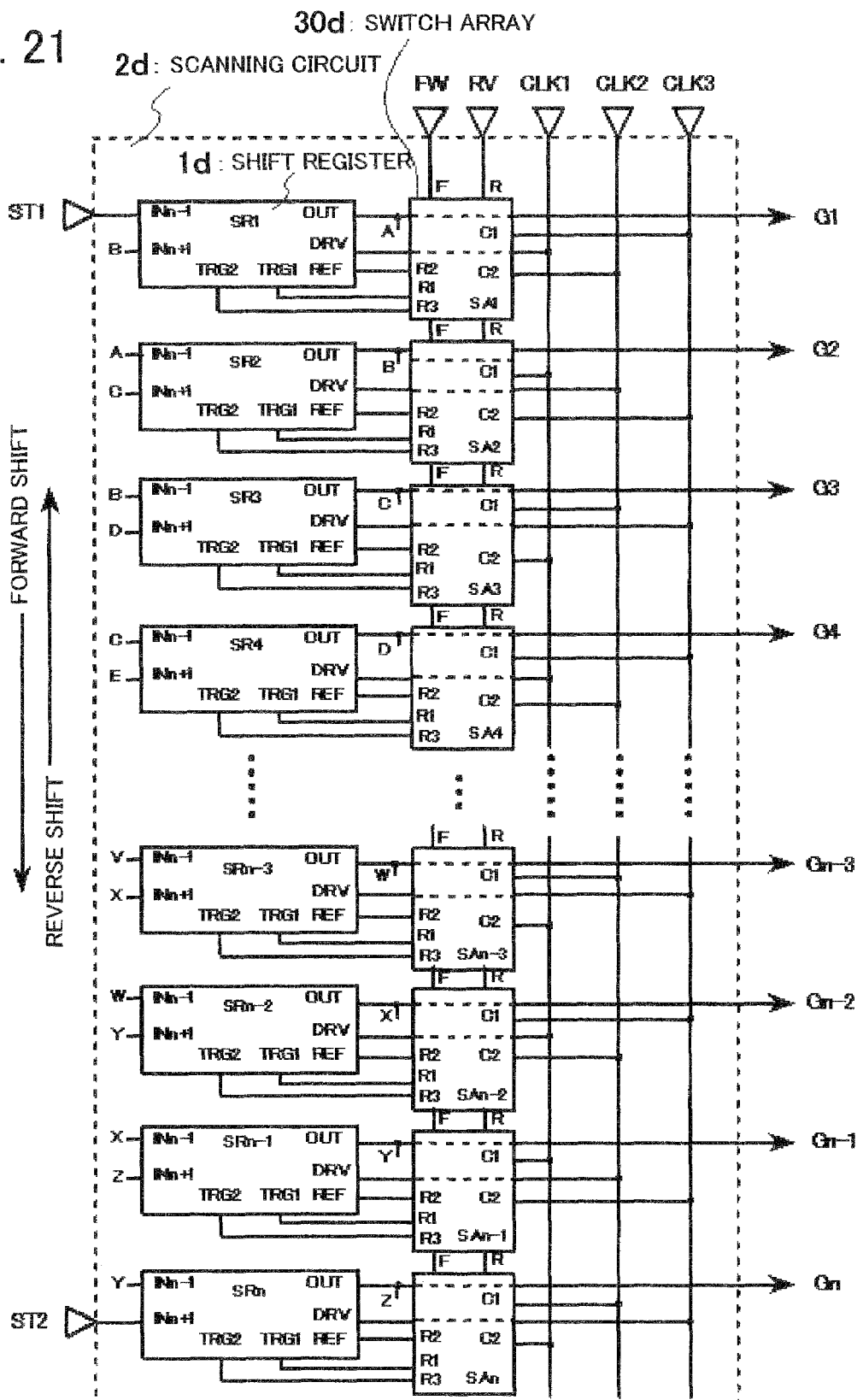
FIG. 21 is a block diagram showing a configuration of a scanning circuit according to a fifth exemplary embodiment of the invention.

The display device according to a fifth exemplary embodiment of the present invention is similar to configurations shown in FIG. 1 and FIG. 2. Furthermore, similar circuits are applied to the pixel portion of a display device shown in FIG. 6. In the present exemplary embodiment, configuration of a scanning circuit is different from the first exemplary embodiment, FIG. 21 is a drawing showing the configuration of the scanning circuit according to the fifth exemplary embodiment of the present invention. In FIG. 21, the scanning circuit 2d is composed of a plurality of shift registers 1d (unit registers represented by SR1, SR2, SRn), a plurality of switch arrays 30d (SA1, . . . SAn), and line groups (lines connected to terminals CLK1, CLK2, CLK3, ST1, ST2, FW, and RV). Gate bus lines 7 are connected to OUT terminals of each of the shift registers 1d of the scanning circuit 2d, and signals from the OUT terminals of the shift registers 1d are transferred to the connected gate bus lines 7.

Figure 22:
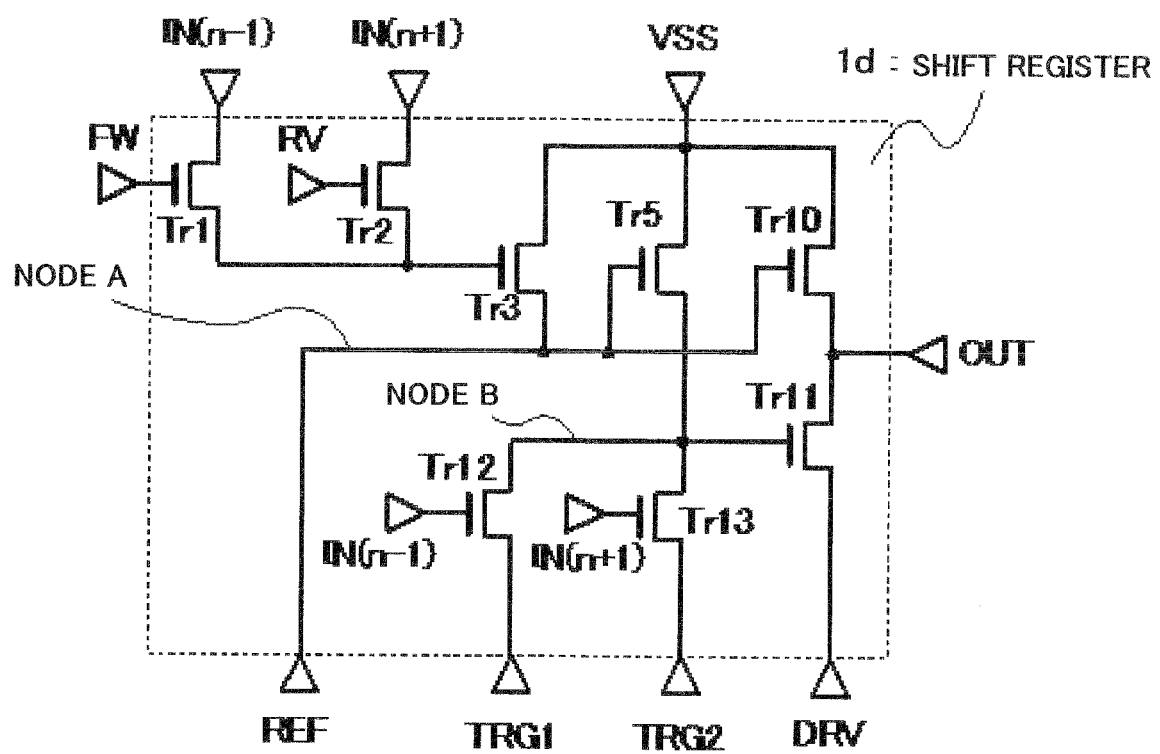
FIG. 22 is a circuit diagram showing a configuration of a shift register according to a fifth exemplary embodiment of the invention.

FIG. 22 is a circuit diagram showing a configuration of a shift register 1d according to the fifth exemplary embodiment of the present invention. In FIG. 22, the shift register 1d is provided with NMOS transistors Tr1~Tr3, Tr5, and Tr10~Tr13, and terminals IN(n−1), IN(n+1), REF, TRG1, TRG2, DRV, FW, RV, OUT, and VSS.

Gates of the NMOS transistors Tr1 and Tr2 are respectively connected to FW and RV, drains are connected to IN(n−1) and IN(n+1), and sources are commonly connected to a gate of the NMOS transistor Tr3. A source of the NMOS transistor Tr3 is connected to VSS, and a drain is connected to a gate of the NMOS transistor Tr10 as a node A.

A gate of the NMOS transistor Tr5 is connected to the node A, a source is connected to VSS, and a drain is connected to a gate of the NMOS transistor Tr11 as a node B.

A source of the NMOS transistor Tr10 is connected to VSS, and a drain is connected to OUT. A source of the NMOS transistor Tr11 is connected to OUT, and a drain is connected to DRV.

A gate of the NMOS transistor Tr12 is connected to IN(n−1), a source is connected to the terminal TRG1, and a drain is connected to the node B. A gate of the NMOS transistor Tr13 is connected to IN(n+1), a source is connected to the terminal TRG1, and a drain is connected to the node B.

In the shift register 1d configured in this way, Tr1~Tr3 and Tr12~Tr13 function as input circuits, and Tr10 and Tr11 function as output circuits.

Furthermore, in the shift register 1d, the IN(n−1) terminal is connected, among adjacent shift registers 1d, to an OUT terminal of an upper-side shift register 1d. The IN(n+1) terminal is connected, among adjacent shift registers 1d, to an OUT terminal of a lower-side shift register 1d. Moreover, signals of any of CLK1, CLK2, and CLK3 are respectively inputted to the DRV terminal. Furthermore, a signal outputted from an R2 terminal of a switch array 30d is inputted to the REF terminal. Moreover, control signals prescribing scanning direction of the scanning circuit 2d are respectively inputted to FW and RV. Furthermore, ST1 and ST2, as start signals for starting transfer, are respectively inputted to the IN(n−1) terminal of the shift register 1d (SR1) and the IN(n+1) terminal of the shift register 1d (SRn). Moreover, at an OUT terminal, a signal at a high level or a low level is outputted by an operation of the shift register 1d, and this signal is applied to a gate bus line 7. At VSS, a constant voltage equivalent to a low level signal is applied.

Figure 23:
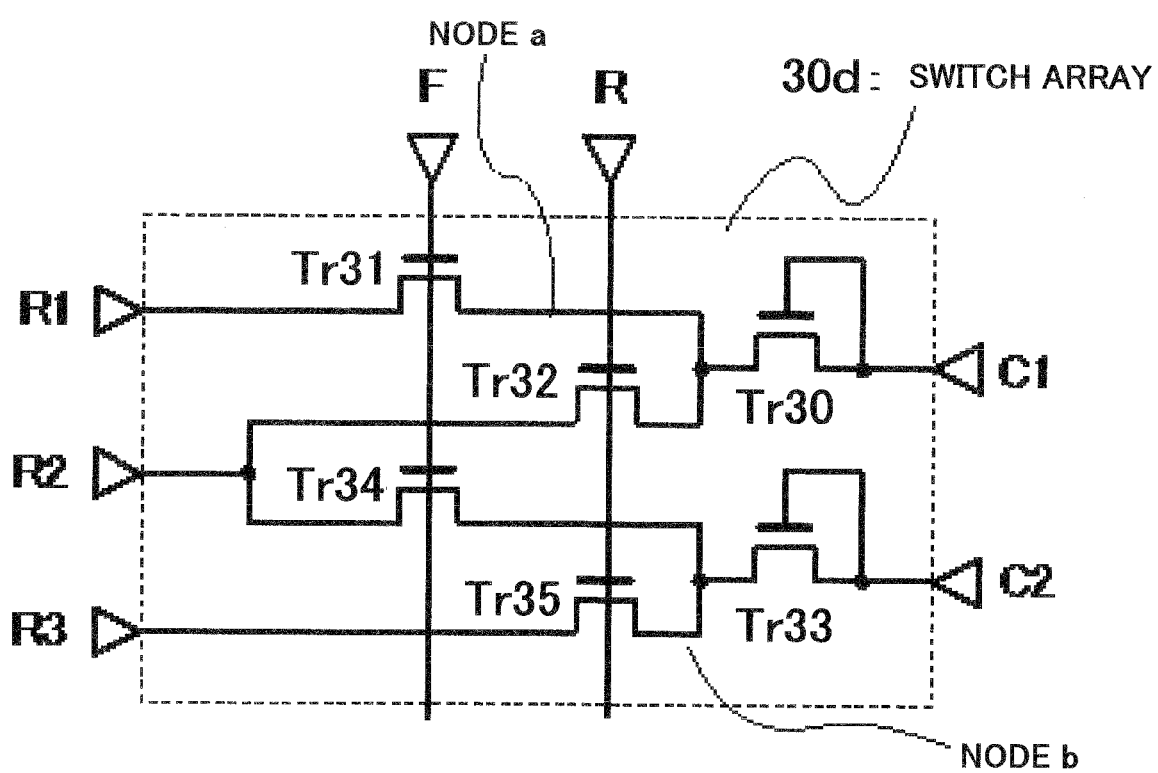
FIG. 23 is a circuit diagram showing a configuration of a switch array according to the fifth exemplary embodiment of the invention.

FIG. 23 is a circuit diagram of a switch array 30d of the present exemplary embodiment. In FIG. 23, the switch array 30d is provided with NMOS transistors Tr30~Tr35, C1~C2 terminals, and R~R3 terminals. F (FW) is connected to gates of Tr31 and Tr34, respectively. Furthermore, R (RW) is connected to gates of Tr22, and Tr25, respectively. As shown in FIG. 23, Tr30 and Tr33 are diode-connected, and are respectively connected to the C1 terminal and the C2 terminal. A clock signal of any of CLK1~CLK3 is supplied to the C1 terminal and the C2 terminal. Corresponding terminals of the shift register 1d are respectively connected to the R1~R3 terminals. The R2 terminal is connected to the REF terminal of the shift register 1d, the R1 terminal is connected to the TRG1 terminal of the shift register 1d, and the R3 terminal is connected to the TRG2 terminal of the shift register 1d. Although not shown in the drawings, the source of Tr12 and the source of Tr13 may respectively have a common configuration. In such cases, the TRG1 terminal and the TRG2 terminal, and lines connected to each of them may have a shorted configuration.

The switch array 30d of the present exemplary embodiment is different from the switch arrays 30, 30a, 30b and 30c of the first to the fourth exemplary embodiment in that Tr30 and Tr33, connected to the C1 terminal and the C2 terminal to which clock signals are supplied, are diode-connected. By Tr30 and Tr33, to which the clock signals are inputted, being diode-connected, since a node A and a node B have a high level not depending on clock signal level (however, a float state exists in a period in which clock signal has a low level), among transistors composing the switch array 30d, gate stress particularly on a transistor in an ON state, is eased, so that it is possible to prevent characteristic change in a transistor.

Figure 11:
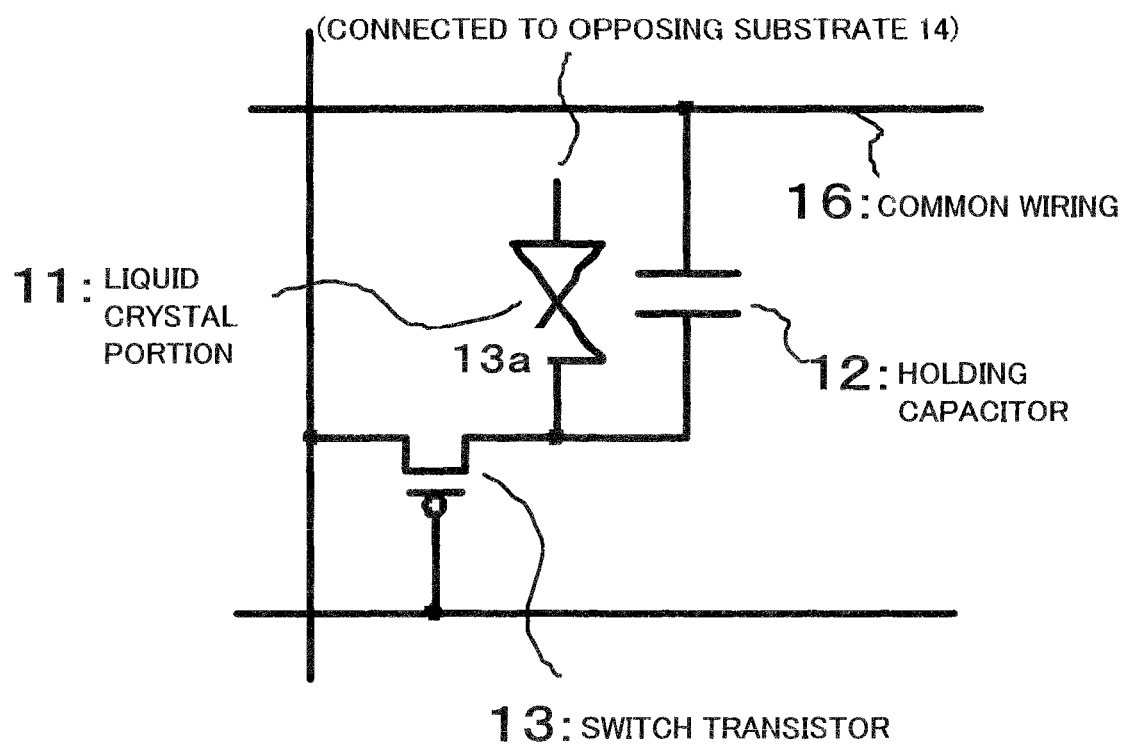
FIG. 11 is a circuit diagram of a pixel portion of the display device according to the second exemplary embodiment of the invention.

As mentioned hereinabove, a description has been given concerning a configuration using NMOS transistors, but the scanning circuit 2d of the present exemplary embodiment can be also be applied to a configuration using PMOS transistors. However, switch transistors in pixels composing a display section 4 are PMOS transistors 13a as shown in FIG. 11. Furthermore, all transistors composing the shift register 1d of FIG. 22, as in a shift register 1e shown in FIG. 24, may be replaced by all PMOS transistors Tr1a~Tr3a, Tr5a, and Tr10a~Tr13a. Furthermore, all transistors composing the switch array 30d of FIG. 23, as shown in the switch array 30e of FIG. 25, may be replaced by all PMOS transistors Tr30a~Tr35a. In addition, VDD may be connected instead of VSS. Connection configuration is similar to FIG. 21.

The shift register 1e and the switch array 30e, configured as above, operate similarly to as described by FIG. 21. However, levels of all signals are the inverse of respective levels of signals in FIG. 21.

As described above, in cases in which the PMOS transistors are used, as in the present exemplary embodiment, since the node A and the node B have a high level not depending on clock signal level (however, a float state exists in a period in which clock signal has a low level), among transistors composing the switch array 30e, gate stress particularly on a transistor in an ON state, is eased, so that it is possible to prevent characteristic change in a transistor.

Description of Operation

Since the scanning circuit 2d of the present exemplary embodiment, similar to the first exemplary embodiment to the fourth exemplary embodiment, handles bidirectional scanning, two types of operation, forward shift and reverse shift are performed.

First, operation of the forward shift is described. The forward shift represents an operation of transferring from top to bottom in the drawing of FIG. 21. A timing chart for the forward shift is shown in FIG. 7.

The forward shift holds a state in which FW is at a high level, and a state in which RV is at a low level, respectively. Therefore, inside the shift registers 1d, Tr1, in which FW is connected to a gate, is in an ON state, and Tr2, to which RV is connected, is in an OFF state.

A start signal for the forward shift uses ST1. Start timing is period T1 in FIG. 7, and in the period T1, ST1 supports a high level. On the other hand, Sr2 holds a low level. When ST1 at a high level is applied to the IN(n−1) terminal of shift register 1d (SR1), Tr3 transits to an ON state, and a low level is applied to node A. At this time, a high level supplied to TRG1 by the switch array 30d (SA1) is inputted via Tr12 to the node B.

Next, in period T2, when ST1 transits to a low level, and CLK1 transits from a low level to a high level, potential of the node B rises, due to a bootstrap effect, and is outputted to OUT, without the CLK1 high level potential lowering. Here, since a signal of OUT1 (OUT of the shift register SR1) is connected to a gate bus line 7 (G1), potential of G1 also transits to a high level.

In addition, in period T3, when CLK1 transits from a high level to a low level, OUT1 also transits to a low level. Here, since a signal of CLK2 from R2 of the switch array 30d (SA1) is transferred via the REF terminal to the node A, the node A transits to a high level. Therefore, Tr10 is in an ON state, and OUT potential and the gate bus line 7 (G1) are held to VSS (reset state).

Next, operation of the shift register 1d (SR2) is described. Since an OUT signal outputted by the shift register 1d (SR1) in period T2 is branched and connected to IN(n−1) of the shift register 1d (SR2), Tr3 and Tr12 of the shift register 1d (SR2) are both in an ON state, and perform an operation similar to the abovementioned shift register 1d (SR1). In the period T3, CLK2 at a high level is outputted to OUT2 (OUT of the shift register SR2), without potential lowering. Since OUT2 is connected to the gate bus line 7 (G2), it transits to a high level, similar to G1.

In addition, in the period T4, since a CLK3 signal outputted from R2 of the switch array 30d (SA1) is transferred via the REF terminal to the node A, the node A transits to a high level, and Tr10 is in an ON state. As a result, potential of OUT2 and the gate bus line 7 (G2) are held to VSS (reset state).

In this way, sequential output and transfer operation are repeated up to OUT (gate bus line 7 (Gn)) of the shift register 1d (SRn).

Next, operation of a reverse shift is described. The reverse shift represents an operation of transferring from bottom to top in the drawing of FIG. 21. A timing chart for reverse scanning is shown in FIG. 8.

The reverse shift maintains a state in which FW is at a low level, and a state in which RV is at a high level, respectively. Therefore, inside the shift registers 1d, Tr1, in which FW is connected to a gate, is in an OFF state, and Tr2, to which RV is connected, is in an ON state.

A start signal for the reverse shift uses ST2. Start timing is period T1 in FIG. 8, and in this period, ST2 maintains a high level. On the other hand, ST1 maintains a low level. When ST2 at a high level is applied to the IN(n+1) terminal of the shift register 1d (SRn), Tr3 transits to an ON state, and a low level is applied to the node A. At this time, a high level transferred to TRG2 from the switch array 30d (SAn) is inputted via Tr13 to the node B.

Next, in period T2, when ST2 transits to a low level, and CLK3 transits from a low level to a high level, potential of the node B rises, due to a bootstrap effect, and is outputted to OUT, without the CLK3 high level potential lowering. Here, since the OUT signal is connected to the gate bus line 7 (Gn), potential of Gn transits to a high level.

In period T3, when CLK3 transits from a high level to a low level, OUT also transits to a low level. Here, since a signal of CLK3 from R2 of the switch array 30d (SAn) is transferred to the node A via the REF terminal, the node A transits to a high level. Therefore, Tr10 is in an ON state, and potential of OUT and the gate bus line 7 (Gn) are maintained to VSS (reset state).

Next, operation of the shift register 1d (SRn−1) is described. Since an OUT signal outputted by the shift register 1d (SRn) in period T2 is branched and connected to IN(n+1) of the shift register 1d (SRn−1), Tr3 and Tr13 of the shift register 1d (SRn−1) are both in an ON state, and perform an operation similar to the abovementioned shift register 1d (SRn), and in period T3, output is performed to OUT, without the CLK2 high level potential lowering. Since OUT is connected to the gate bus line 7 (Gn−1), it transits to a high level, similar to Gn.

In addition, in period T4, since a signal of CLK1 outputted from R2 of the switch array 30 (SAn−1) is transferred to Tr4 via the REF terminal, the node A transits to a high level (in actuality, a voltage obtained by lowering a high level potential by a Tr4 threshold voltage component). Therefore, Tr10 is in an ON state, and potential of OUT is held to VSS (reset state).

In this way, sequential output and transfer operation are repeated up to OUT (gate bus line 7 (G1)) of the shift register 1d (SR1).

Figure 24:
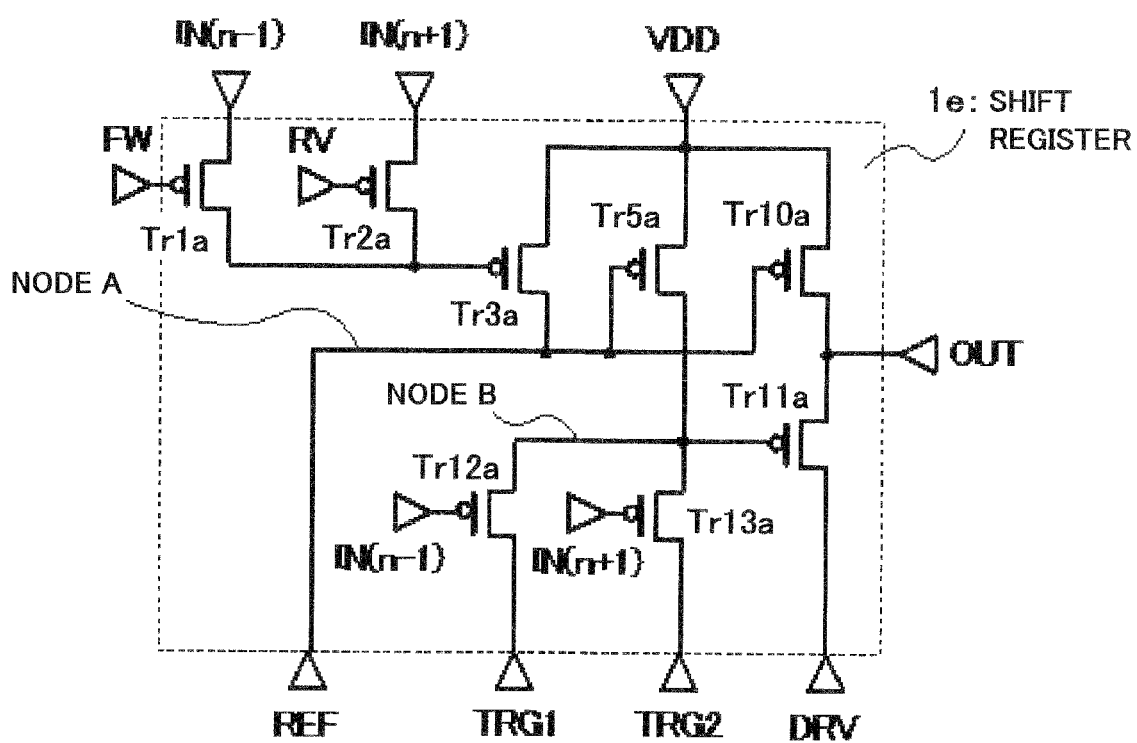
FIG. 24 is a circuit diagram showing another configuration of the shift register according to the fifth exemplary embodiment of the invention.
Figure 25:
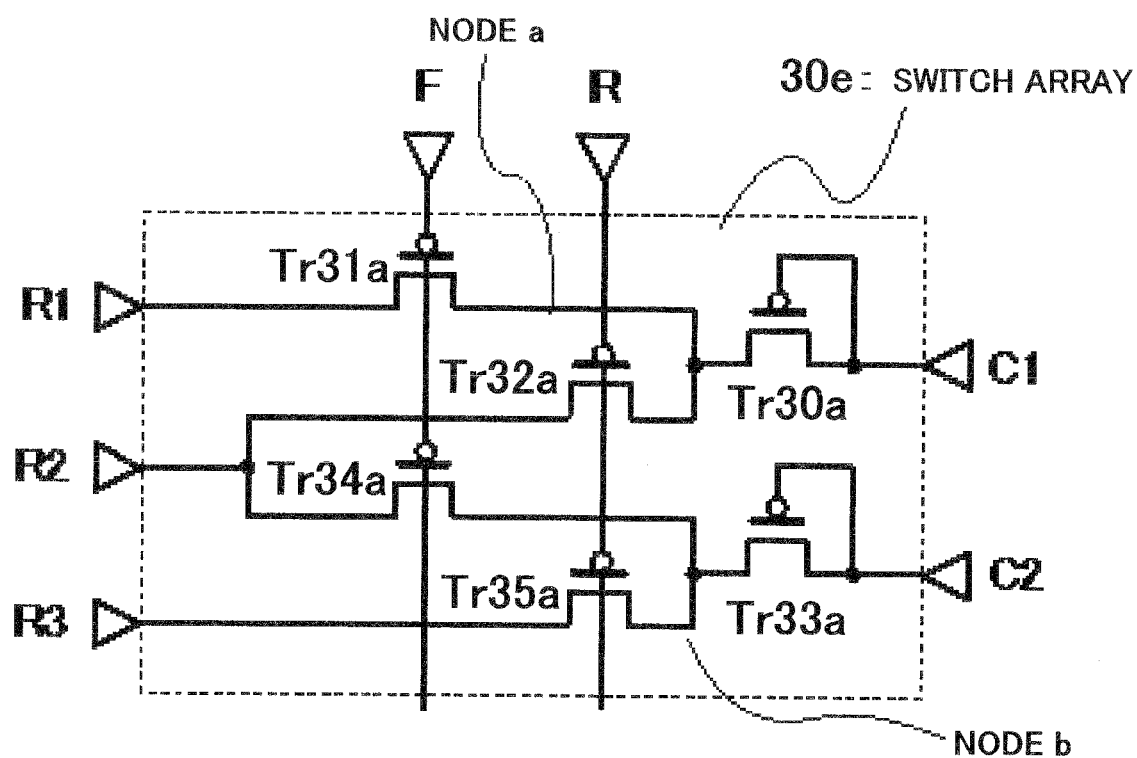
FIG. 25 is a circuit diagram showing another configuration of the switch array according to the fifth exemplary embodiment of the invention.

With regard to operation of other configurations of the shift register 1e and the switch array 30e composed of PMOS transistors shown in FIG. 24 and FIG. 25, excluding the point that levels of all signals shown in FIG. 12 and FIG. 13 operate with inverse levels, with respect to levels of signals shown in FIG. 7 and FIG. 8, fundamentally, operation is performed similarly to cases of NMOS transistors.

In this way, according to the configuration and drive method of the present exemplary embodiment, it is possible to reduce the number of transistors composing the scanning circuit, and even if pixel pitch and length in a longitudinal direction of the drawing of the shift registers are shortened, accompanying higher resolution of the display section 4, it is possible not only to avoid a problem in which frame-edge of the display device becomes large, but also to prevent characteristic change due to gate stress of a transistor composing the switch arrays.

Sixth Exemplary Embodiment

A display device according to a sixth exemplary embodiment of the present invention is similar to configurations shown in FIG. 1 and FIG. 2. In the present exemplary embodiment, configuration of a scanning circuit is different from the fifth exemplary embodiment.

Figure 26:
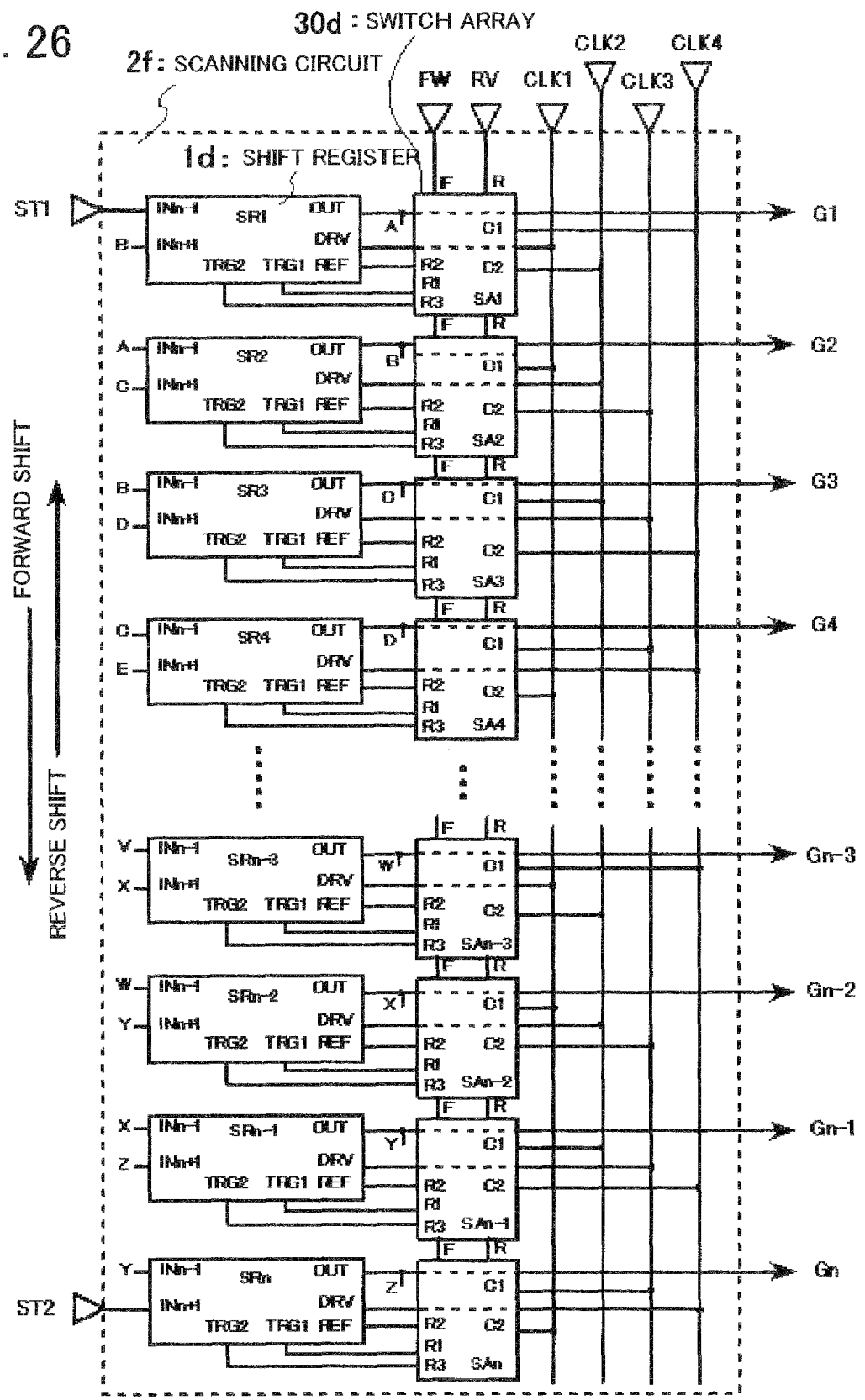
FIG. 26 is a block diagram showing a configuration of a scanning circuit according to a sixth exemplary embodiment of the invention.

FIG. 26 is a drawing showing the configuration of the scanning circuit according to the sixth exemplary embodiment of the present invention. In FIG. 26, a scanning circuit 2f is composed of a plurality (stages) of shift registers 1d (unit registers represented by SR1, SR2, . . . SRn), a plurality of switch arrays 30d (SA1, . . . SAn), and line groups (lines connected to terminals CLK1, CLK2, CLK3, CLK4, ST1, ST2, FW, and RV). Gate bus lines 7 are connected to OUT terminals of each of the shift registers 1d of the scanning circuit 2f, and signals from the OUT terminals of the shift registers 1d are transferred to the connected gate bus lines 7.

Here, the shift registers 1d and the switch arrays 30d in the drawing may have configurations shown in FIG. 22 and FIG. 23 similar to the fifth exemplary embodiment, or may have configurations of FIG. 24 and FIG. 25.

In the scanning circuit 2f of the present exemplary embodiment, although a clock signal inputted to the switch arrays is of a four clock system and is different from the fifth exemplary embodiment, phase relationships of signals inputted respectively to a DRV terminal, a TRG1 terminal, a TRG2 terminal, and a REF terminal of the shift register 1d have similar operation to the fifth exemplary embodiment, and descriptions thereof are omitted.

As described above, in the present exemplary embodiment, in cases in which the four clock system scanning circuit is used, it is possible to realize the scanning circuit in which an effect similar to the fifth exemplary embodiment is obtained, and a display device using the scanning circuit.

Seventh Exemplary Embodiment

Figure 27:
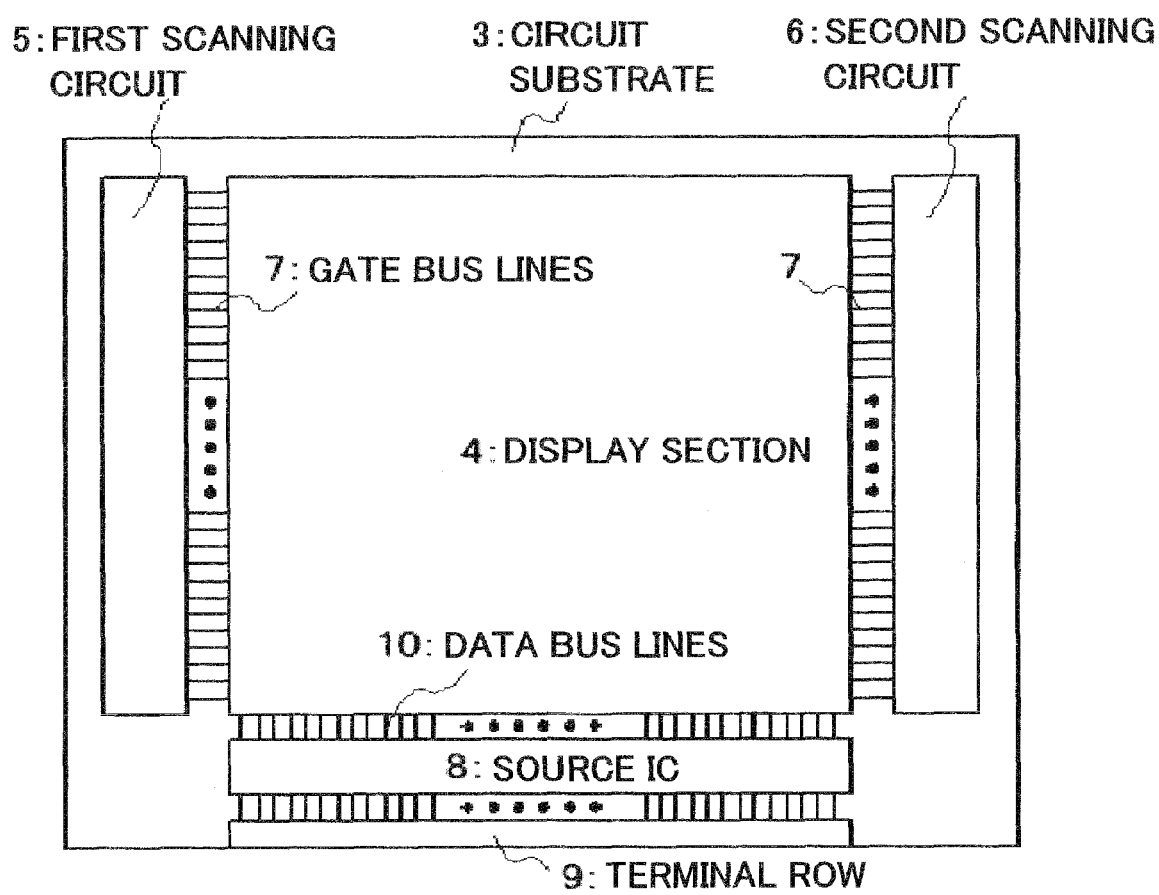
FIG. 27 is a configuration diagram showing a display device according to a seventh exemplary embodiment of the invention.
Figure 28:
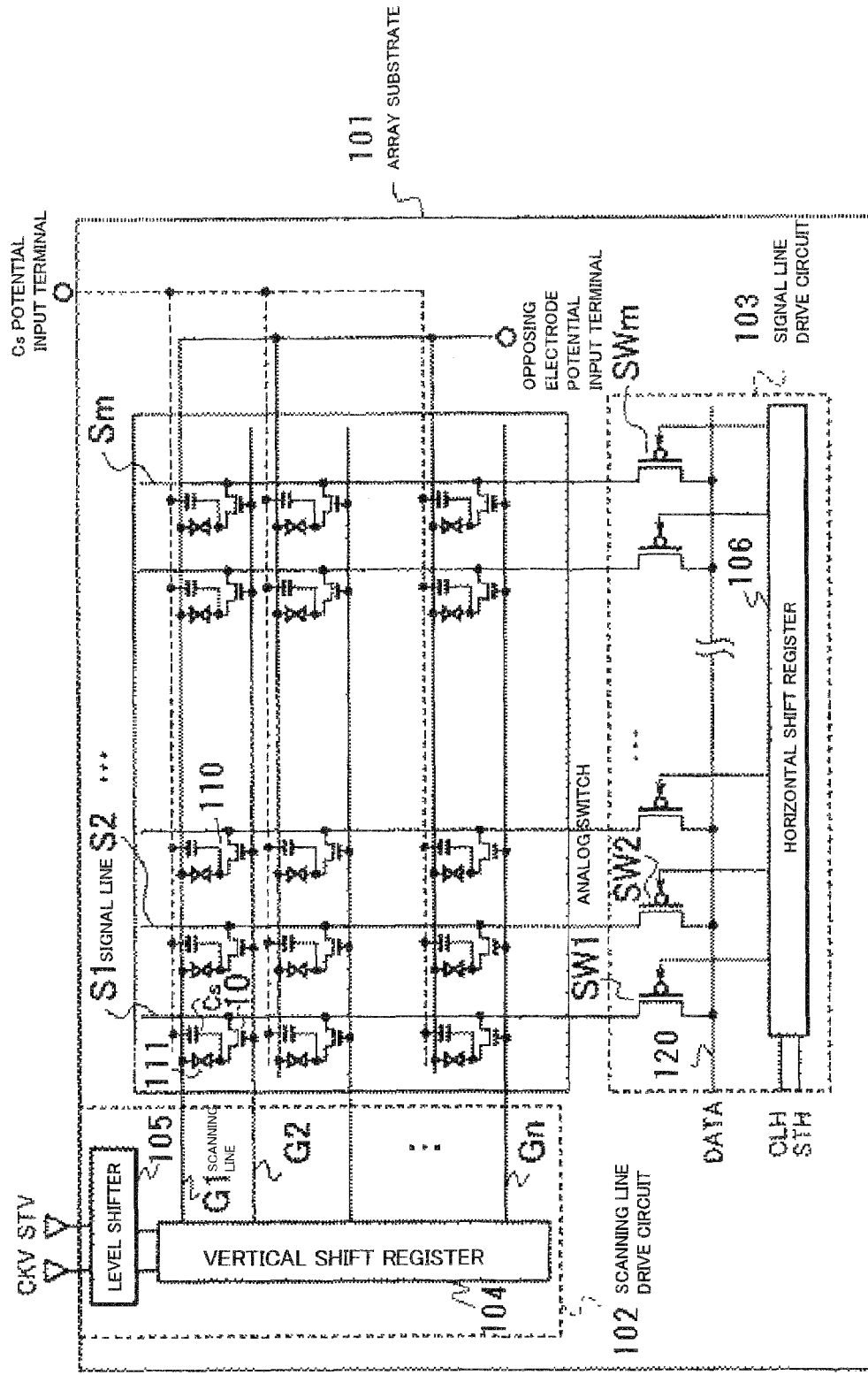
FIG. 28 is a schematic diagram of a flat display device of Patent Document 1.

FIG. 27 is a configuration diagram of a display device according to a seventh exemplary embodiment of the present invention. In FIG. 7, the display device is provided with a display section 4, a first scanning circuit 5, a second scanning circuit 6, gate bus lines 7, a source IC 8, a terminal row 9, and data bus lines 10, on an insulating substrate 3. A difference between the present exemplary embodiment and other exemplary embodiments is in the fact that the first scanning circuit 5 and the second scanning circuit 6 are provided. The configuration is such that output parts of each of the first scanning circuit 5 and the second scanning circuit 6 are connected to the gate bus lines 7, and signals outputted at the same time from the first scanning circuit 5 and the second scanning circuit 6 are supplied to the connected gate bus lines 7. Here, with regard to the first scanning circuit 5 and the second scanning circuit 6, circuits described in any of the first to the sixth exemplary embodiment are preferably applied.

Here, in the gate bus lines 7, capacitance component and resistance component interpose as loads. When a load on the gate bus lines 7 becomes large, time necessary for transiting from a low level to a high level, for example, also increases. However, in the display device of the present exemplary embodiment, since the first scanning circuit 5 and the second scanning circuit 6 operate so as to drive a load of the gate bus lines 7 from both sides at the same time, it is possible to eliminate the above problem.

The display device of the present exemplary embodiment has a scanning circuit of any of the first exemplary embodiment to the sixth exemplary embodiment, and corresponding operations are performed. In this way, from the configuration and drive method of the present exemplary embodiment, it is possible to provide the display device which, while possessing an effect of any of the first exemplary embodiment to the fourth exemplary embodiment, in addition can be applied in cases in which load of the gate bus lines becomes large.

Each disclosure of the above mentioned patent documents is incorporated by reference thereto into the present application. Modifications and adjustments of embodiments and examples are possible within bounds of the entire disclosure (including the scope of the claims) of the present invention, and also based on fundamental technological concepts thereof. Furthermore, a wide variety combinations and selections of various disclosed elements are possible within the scope of the claims of the present invention. That is, the present invention clearly includes every type of transformation and modification that a person skilled in the art can realize according to technological concepts and the entire disclosure including the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A bidirectional shift register comprising:
   a plurality of serially connected unit registers in which transfer is controlled by any of three or more clock signals each having a different phase from one another, and a setting signal which determines shift direction, the any one of the three or more clock signals being commonly input to each of the serially connected unit registers; and
   a selection circuit which inputs said three or more clock signals and said setting signal which determines shift direction, and transfers a clock signal selected from said three or more clock signals in accordance with said setting signal; wherein
   said selection circuit is connected to output the clock signal selected from said three or more clock signals to at least two of said plurality of serially connected unit registers;
   said selection circuit comprises at least a first selection transistor and a second selection transistor;
   in said first selection transistor, wiring for any of said three or more clock signals is connected to a gate electrode and a source electrode, and a drain electrode is connected to a source electrode of said second selection transistor; and
   in said second selection transistor, wiring for said setting signal is connected to a gate electrode, and said selected one clock signal is outputted from a drain electrode so as to put said unit registers in a reset state.

2. The bidirectional shift register according to claim 1, wherein each of said unit registers comprises:
   an output terminal;
   an output circuit which drives said output terminal;
   an input circuit into which an output signal of an adjacent unit register and said setting signal are inputted, and which drives said output circuit to put said output terminal at an active level, based on said output signal and said setting signal; and
   a reset transistor which drives said output circuit so as to put said output terminal at an inactive level, by one clock signal selected by said selection circuit.

3. The bidirectional shift register according to claim 2, wherein
   said output circuit includes a first output transistor which provides control to put said output terminal at an inactive level; and
   said reset transistor is diode-connected, one clock signal selected by said selection circuit being supplied to a drain, and a source being connected to a gate of said first output transistor.

4. The bidirectional shift register according to claim 2, wherein
   said output circuit includes a second output transistor which provides control to put said output terminal at an active level;
   said input circuit includes a first, a second, and a third input transistor;
   said first input transistor is diode-connected, another clock signal selected by said selection circuit being supplied to a drain, and a source being connected to a drain of said second and third input transistors; and
   output signals of one and another adjacent unit registers are supplied to respective gates of said second and third input transistors, and sources are commonly connected to a gate of said second output transistor.

5. The bidirectional shift register according to claim 1, wherein
said selection circuit includes a switch element which switches to an ON state or an OFF state according to said setting signal, and
said three or more clock signals are selectively outputted to said unit register(s), by said switch element.

6. The bidirectional shift register according to claim 1, wherein
said first selection transistor is controlled to an ON state or an OFF state by any of said three or more clock signals; and
said second selection transistor is controlled to an ON state or an OFF state by said setting signal.

7. The bidirectional shift register according to claim 1, wherein each of said unit registers comprises:
an output terminal;
an output circuit which drives said output terminal; and
an input circuit into which an output signal of an adjacent unit register and said setting signal are inputted, and which drives said output circuit to put said output terminal at an active level, based on said output signal and said setting signal; and wherein
said output circuit includes a first output transistor in which one clock signal selected by said selection circuit is supplied to a gate to perform control to put said output terminal at an inactive level.

8. The bidirectional shift register according to claim 7, wherein
said output circuit includes a second output transistor which performs control to put said output terminal at an active level;
said input circuit includes first and said second input transistors;
with regard to said first and said second input transistors, a drain of one of said first and said second input transistors selected by said setting signal is supplied with another clock signal selected by said selection circuit, output signals of one and another adjacent unit registers are supplied to respective gates, and sources are commonly connected to a gate of said second output transistor.

9. A bidirectional shift register according to claim 1, wherein
said selection circuit is provided for all of said plurality of unit registers, or per a prescribed number of said unit registers.

10. A display device comprising a pixel array in which a plurality of pixels is arrayed, and a scanning circuit which makes said pixels active, wherein said scanning circuit includes said bidirectional shift register according to claim 1.

11. The display device according to claim 10, wherein transistors included in said bidirectional shift register and switch transistors in said pixels comprise only one of either NMOS transistors or PMOS transistors.

12. The display device according to claim 10, wherein scanning circuits are provided on each of both sides of a layout region of said pixel array.

13. The display device according to claim 12, wherein said scanning circuits provided on each of both sides of said layout region of said pixel array drive a gate of an identical switch transistor at the same time.

14. A bidirectional shift register according to claim 1, wherein
said selection circuit is provided for all of said plurality of unit registers.

15. The bidirectional shift register according to claim 1, wherein said selection circuit receives a scanning direction setting signal prescribing a scanning direction, and selects the transferred clock signal among the plurality of clock signals in accordance with the scanning direction setting signal.

16. A bidirectional shift register comprising:
plural serially connected unit registers in which transfer is controlled by i) any of three or more clock signals each having a different phase from one another, and ii) a setting signal which determines shift direction, the any one of the three or more clock signals being commonly input to each of the serially connected unit registers; and
a selection circuit inputting said three or more clock signals and said setting signal which determines shift direction, and transferring a clock signal selected from said three or more clock signals in accordance with said setting signal; wherein,
said selection circuit is connected to output the clock signal selected from said three or more clock signals to at least two or more of said plural serially connected unit registers for controlling said plural serially connected unit registers, each unit register put in a reset state by one of the clock signals selected by the selection circuit, corresponding respectively to each of the unit registers,
said selection circuit comprising at least a first selection transistor and a second selection transistor, a first clock terminal connected to a first transistor and a second clock terminal connected to second transistor, the first and second transistors being diode-connected connected between the first and second selection transistors;
in said first selection transistor, wiring for any of said three or more clock signals is connected to a gate electrode and a source electrode, and a drain electrode is connected to a source electrode of said second selection transistor; and
in said second selection transistor, wiring for said setting signal is connected to a gate electrode, and said selected one clock signal is outputted from a drain electrode so as to put said unit registers in the reset state.

17. A bidirectional shift register according to claim 16, wherein
said selection circuit is provided for all of said plurality of unit registers.

18. The bidirectional shift register according to claim 16, wherein said selection circuit receives a scanning direction setting signal prescribing a scanning direction, and selects the transferred clock signal among the plurality of clock signals in accordance with the scanning direction setting signal.

* * * * *